(12) United States Patent
Baba

(10) Patent No.: US 10,772,204 B2
(45) Date of Patent: Sep. 8, 2020

(54) ELECTRONIC DEVICE

(71) Applicant: Murata Manufacturing Co., Ltd., Nagaokakyo-shi, Kyoto-fu (JP)

(72) Inventor: Takahiro Baba, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/437,166

(22) Filed: Jun. 11, 2019

(65) Prior Publication Data

US 2019/0297727 A1 Sep. 26, 2019

Related U.S. Application Data

(63) Continuation of application No. PCT/JP2017/047172, filed on Dec. 28, 2017.

(30) Foreign Application Priority Data

Jan. 5, 2017 (JP) .................................. 2017-000567

(51) Int. Cl.
*H05K 1/02* (2006.01)
*H05K 1/18* (2006.01)
(Continued)

(52) U.S. Cl.
CPC ............... *H05K 1/114* (2013.01); *H05K 1/02* (2013.01); *H05K 1/14* (2013.01); *H05K 1/181* (2013.01)

(58) Field of Classification Search
CPC .. H05K 1/02; H05K 1/18; H01P 1/203; H01P 1/213; H01P 3/08; H01P 5/02; H01P 5/04
(Continued)

(56) References Cited

U.S. PATENT DOCUMENTS 5,631,446 A * 5/1997 Quan .................... H01R 12/62
174/254
9,401,531 B2 * 7/2016 Iida .......................... H01P 3/08
(Continued)

FOREIGN PATENT DOCUMENTS

| JP | 04-058585 A | 2/1992 |
|---|---|---|
| JP | 2003-273491 A | 9/2003 |
| WO | 2016/088592 A1 | 6/2016 |

OTHER PUBLICATIONS

Official Communication issued in International Patent Application No. PCT/JP2017/047172, dated Apr. 3, 2018.

*Primary Examiner* — Xiaoliang Chen
(74) *Attorney, Agent, or Firm* — Keating & Bennett, LLP

(57) ABSTRACT

An electronic device includes a circuit board, and first and second elements. The first element includes a first connection portion including a recess portion, and first connection portion side electrodes exposed to the first connection portion. The second element includes a second connection portion and second connection portion side electrodes exposed to the second connection portion. The circuit board includes first and second board side electrodes respectively disposed at positions opposed to each other in plan view. The first connection portion side electrode and the second connection portion side electrode are joined to the first board side electrode and the second connection portion side electrode connected to each other. The first connection portion side electrode and the first board side electrode are disposed along the recess portion in plan view of the circuit board.

20 Claims, 18 Drawing Sheets

(51) Int. Cl.
*H01P 1/203* (2006.01)
*H01P 1/213* (2006.01)
*H01P 3/08* (2006.01)
*H01P 5/02* (2006.01)
*H01P 5/04* (2006.01)
*H05K 1/11* (2006.01)
*H05K 1/14* (2006.01)

(58) Field of Classification Search
USPC ............. 361/760; 333/12, 33, 238; 174/254, 174/261; 362/249.02
See application file for complete search history.

(56) References Cited

U.S. PATENT DOCUMENTS

| | | | | |
|---|---|---|---|---|
| 9,401,534 | B2* | 7/2016 | Kato | H01P 3/08 |
| 2012/0097433 | A1* | 4/2012 | Kato | H05K 1/028 |
| | | | | 174/254 |
| 2013/0127560 | A1* | 5/2013 | Kato | H03H 7/38 |
| | | | | 333/12 |
| 2013/0141912 | A1* | 6/2013 | Kim | H05K 1/0277 |
| | | | | 362/249.02 |
| 2013/0207740 | A1* | 8/2013 | Kato | H01P 3/082 |
| | | | | 333/33 |
| 2014/0176254 | A1* | 6/2014 | Iida | H03H 7/38 |
| | | | | 333/33 |
| 2014/0176266 | A1* | 6/2014 | Kato | H01P 3/088 |
| | | | | 333/238 |
| 2015/0091674 | A1* | 4/2015 | Kato | H01P 5/00 |
| | | | | 333/238 |
| 2015/0325900 | A1* | 11/2015 | Baba | H01P 5/12 |
| | | | | 333/134 |
| 2015/0351222 | A1* | 12/2015 | Baba | H01P 3/082 |
| | | | | 333/238 |
| 2016/0372811 | A1* | 12/2016 | Yosui | H01P 3/08 |
| 2017/0125870 | A1 | 5/2017 | Baba et al. | |

\* cited by examiner

ELECTRONIC DEVICE

CROSS REFERENCE TO RELATED APPLICATIONS

This application claims the benefit of priority to Japanese Patent Application No. 2017-000567 filed on Jan. 5, 2017 and is a Continuation Application of PCT Application No. PCT/JP2017/047172 filed on Dec. 28, 2017. The entire contents of each of these applications are hereby incorporated herein by reference.

BACKGROUND OF THE INVENTION

1. Field of the Invention

The present invention relates to an electronic device, and in particular, an electronic device including a circuit board and an element joined to the surface of the circuit board.

2. Description of the Related Art

In recent years, with high functionality and miniaturization of high-frequency electronic devices, such as mobile communication terminals, it may not be possible to ensure a sufficient space for housing coaxial cables in a terminal housing. For this reason, a flat cable (hereinafter referred to as "first element") including a transmission line formed by laminating thin base material sheets may be used.

International Publication No. 2016/088592 discloses an electronic device having a structure in which the first element is connected to a circuit formed in contact with a circuit board by joining a plurality of electrodes exposed at an end portion of the first element to a plurality of electrodes formed on the circuit board. In the above structure, a small electronic device is able to be achieved as compared with the case of connecting to a circuit formed in contact with a circuit board using a connector (receptacle) or the like. In the above structure, since it is not necessary to provide a connector (receptacle) or the like, the number of components is reduced.

Not only an electronic device having a structure in which the first element is connected to the circuit formed in contact with the circuit board, but also an electronic device having a structure in which the end portion of the first element and another element (hereinafter referred to as "second element") mounted on the circuit board are connected via a plurality of conductor patterns formed on the surface of the circuit board may be considered.

However, in such an electronic device, the following problems (a) and (b) may occur, and as a result, the footprint on the circuit board necessary for connection between the first element and the second element may increase.

(a) When a multitude of electrodes are concentrated at the end portion of the first element, the footprint of the end portion of the first element increases.

(b) Depending on the arrangement of a multitude of electrodes exposed at the end portion of the first element and the arrangement of a multitude of electrodes exposed to the second element, a plurality of conductor patterns connecting the electrodes cannot be routed in the shortest distance. Therefore, the line lengths of the plurality of conductor patterns become long, and a large space for routing the plurality of conductor patterns is required on the surface of the circuit board.

SUMMARY OF THE INVENTION

Preferred embodiments of the present invention provide electronic devices each having a small footprint on a circuit board necessary to connect between a first element and a second element in a structure in which the first element and the second element including a plurality of electrodes in a connection portion are connected to each other via a conductor pattern provided on the circuit board.

An electronic device according to a preferred embodiment of the present invention includes a circuit board; a first element including a first surface and at least a portion of which is joined to a surface of the circuit board; and a second element including a second surface and at least a portion of which is joined to the surface of the circuit board, wherein the first element includes a first connection portion including a first recess portion, a third connection portion, a first transmission line portion connecting the first connection portion and the third connection portion to each other, and a plurality of first connection portion side electrodes exposed to the first surface of the first connection portion; the second element includes a second connection portion and a plurality of second connection portion side electrodes exposed to the second surface of the second connection portion; the circuit board includes a plurality of first board side electrodes, a plurality of second board side electrodes, and a plurality of electrode connection patterns connecting the plurality of first board side electrodes and the plurality of second board side electrodes to each other; the plurality of first connection portion side electrodes and the plurality of first board side electrodes are opposed to each other and are each joined with a conductive joining material; the plurality of second connection portion side electrodes and the plurality of second board side electrodes are opposed to each other and are each joined with a conductive joining material; the plurality of first connection portion side electrodes and the plurality of first board side electrodes are respectively disposed along the first recess portion in plan view of the circuit board; and the plurality of first board side electrodes and the plurality of second board side electrodes are respectively disposed at positions opposed to each other in plan view of the circuit board.

In this structure, it is not necessary to provide a plurality of electrode connection patterns so as to detour other conductor patterns, and thus, the line lengths of the plurality of electrode connection patterns are able to be shortened as compared to a case of providing a plurality of electrode connection patterns so as to detour other conductor patterns. Accordingly, this structure enables the footprint necessary to connect between the first connection portion and the second connection portion to be reduced and enables conductor loss to be reduced.

In an electronic device according to a preferred embodiment of the present invention, the plurality of second connection portion side electrodes and the plurality of second board side electrodes are preferably disposed such that at least portions thereof overlap the first recess portion in plan view of the circuit board. According to this structure, it is possible to further shorten the line length of the electrode connection pattern connecting between the first board side electrode and the second board side electrode. Accordingly, the footprint necessary to connect between the first connection portion and the second connection portion is able to be further reduced and the conductor loss is able to be further reduced.

In an electronic device according to a preferred embodiment of the present invention, the plurality of second connection portion side electrodes and the plurality of second board side electrodes are preferably disposed along the first recess portion in plan view of the circuit board. According to this structure, as compared to a case in which the second connection portion side electrode and the second board side electrode are not disposed along the first recess portion in plan view of the circuit board, it becomes easy to ensure the distance (isolation) between the plurality of first connection portion side electrodes, between the plurality of second connection portion side electrodes, between the plurality of first board side electrodes, and between the plurality of second board side electrodes, thus facilitating the design of the characteristic impedance. Further, since the distance between the plurality of electrode connection patterns is able to be easily ensured, it is not necessary to narrow the line widths of the plurality of electrode connection patterns, and the conductor loss of the electrode connection patterns does not increase.

In an electronic device according to a preferred embodiment of the present invention, a width of the first connection portion in a width direction of the first transmission line portion is preferably thicker than a width of the first transmission line portion. According to this structure, the degree of freedom of the shape of the first recess portion provided in the first connection portion is able to be improved, and the distance (isolation) between the first connection portion side electrodes is able to be further easily ensured.

In an electronic device according to a preferred embodiment of the present invention, it is preferable that the first element includes a plurality of third connection portion side electrodes exposed to the first surface of the third connection portion, the circuit board includes a plurality of third board side electrodes, and the plurality of third connection portion side electrodes and the plurality of third board side electrodes are opposed to each other and are each joined with a conductive joining material. According to this structure, in the same or similar manner as the other surface mounted components, the first element is able to be mounted as a surface mounted component by a reflow process. Thus, the manufacturing process is able to be simplified. Also according to this structure, transmission loss is reduced as compared with a case in which the first element is connected using a connector and a receptacle.

In an electronic device according to a preferred embodiment of the present invention, a width of the first connection portion in a width direction of the first transmission line portion and a width of the third connection portion in the width direction of the first transmission line portion are preferably thicker than a width of the first transmission line portion. According to this structure, even if the first transmission line portion has an elongated shape, when the first element is disposed on the surface of the circuit board, the stability of the first element disposed on the surface of the circuit board increases, thus increasing the mountability of the first element.

In an electronic device according to a preferred embodiment of the present invention, the first transmission line portion may include a first signal conductor, and the plurality of first connection portion side electrodes may include a first signal electrode electrically connected to the first signal conductor.

In an electronic device according to a preferred embodiment of the present invention, the first transmission line portion may include a first ground conductor, and the first connection portion side electrode may include a first ground electrode connected to the first ground conductor.

In an electronic device according to a preferred embodiment of the present invention, a plurality of the first signal conductors may be provided.

In an electronic device according to a preferred embodiment of the present invention, the second element may further include a fourth connection portion and a second transmission line portion which connects the second connection portion and the fourth connection portion to each other.

In an electronic device according to a preferred embodiment of the present invention, a width of the second connection portion in a width direction of the second transmission line portion is preferably thicker than a width of the second transmission line portion. According to this structure, the degree of freedom of the shape of a second recess portion provided in the second connection portion is able to be improved, and the distance (isolation) between the second connection portion side electrodes is able to be further easily ensured.

In an electronic device according to a preferred embodiment of the present invention, it is preferable that the second element includes a plurality of fourth connection portion side electrodes exposed to the second surface of the fourth connection portion, the circuit board includes a plurality of fourth board side electrodes, and the plurality of fourth connection portion side electrodes and the plurality of fourth board side electrodes are opposed to each other and are each joined with a conductive joining material. According to this structure, in the same or similar manner as the other surface mounted components, the second element is able to be mounted as a surface mounted component by a reflow process. Thus, the manufacturing process is able to be simplified. Also according to this structure, transmission loss is reduced as compared with a case in which the second element is connected using a connector and a receptacle.

In an electronic device according to a preferred embodiment of the present invention, a width of the second connection portion in a width direction of the second transmission line portion and a width of the fourth connection portion in a width direction of the second transmission line portion are preferably thicker than a width of the second transmission line portion. According to this structure, even if the second transmission line portion has an elongated shape, when the second element is disposed on the surface of the circuit board, the stability of the second element disposed on the surface of the circuit board increases, thus increasing the mountability of the second element.

In an electronic device according to a preferred embodiment of the present invention, the second transmission line portion may include a second signal conductor, and the plurality of second connection portion side electrodes may include a second signal electrode connected to the second signal conductor.

In an electronic device according to a preferred embodiment of the present invention, the second transmission line portion may include a second ground conductor, and the plurality of second connection portion side electrodes may include a second ground electrode connected to the second ground conductor.

In an electronic device according to a preferred embodiment of the present invention, a plurality of the second signal conductors may be provided.

In an electronic device according to a preferred embodiment of the present invention, it is preferable that the second connection portion includes a second recess portion, the plurality of second connection portion side electrodes and the plurality of second board side electrodes are disposed along the second recess portion in plan view of the circuit board, and the plurality of first connection portion side electrodes and the plurality of first board side electrodes are disposed such that at least portions thereof overlap the second recess portion in plan view of the circuit board. In this structure, a portion of a second connection portion CN2 is disposed in the first recess portion, and a portion of a first connection portion CN1 is disposed in the second recess portion. Therefore, the footprint necessary to connect between the first connection portion and the second connection portion is able to be further reduced, and the conductor loss is able to be further reduced.

According to preferred embodiments of the present invention, it is possible to provide electronic devices each having a small footprint on a circuit board necessary to connect between a first element and a second element in a structure in which the first element and the second element including a plurality of electrodes in a connection portion are connected to each other via a conductor pattern provided on the circuit board.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
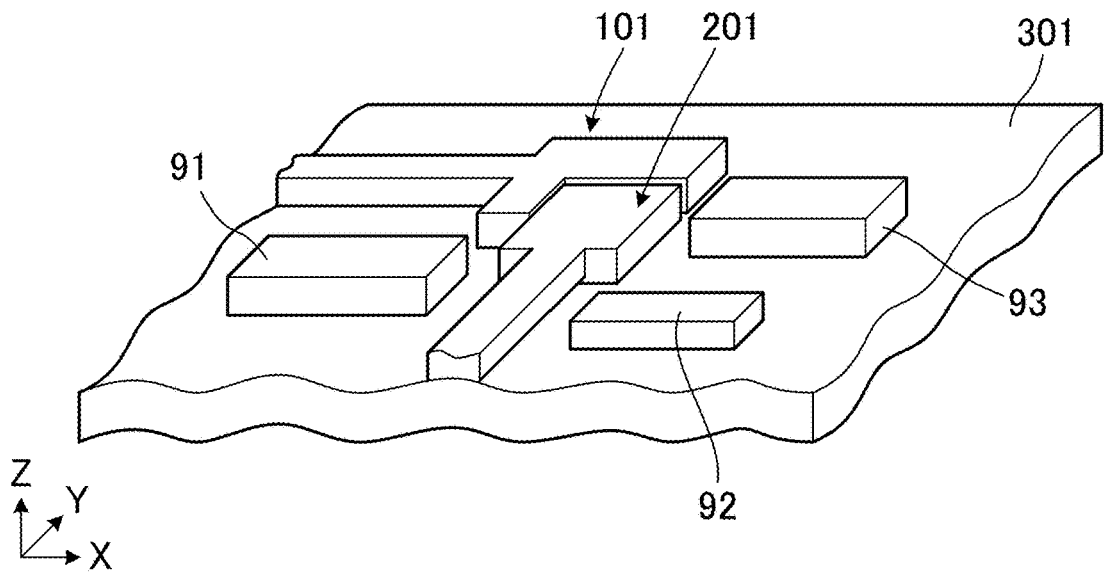
FIG. 1A is an external perspective view showing a main portion of an electronic device 401 according to a first preferred embodiment of the present invention.

Hereinafter, preferred embodiments of the present invention will be described with reference to several specific examples and to the drawings. The same reference numerals are used for the same or substantially the same portions in the drawings. While the preferred embodiments are shown separately in consideration of the description of main points or ease of understanding, it is possible to partially replace or combine the structures shown in different preferred embodiments. In the second and subsequent preferred embodiments, descriptions of matters in common with the first preferred embodiment will be omitted, and only different points will be described. Particularly, the same advantageous operations and effects with the same or similar structures will not be mentioned in each of the preferred embodiments.

First Preferred Embodiment

Figure 1B:
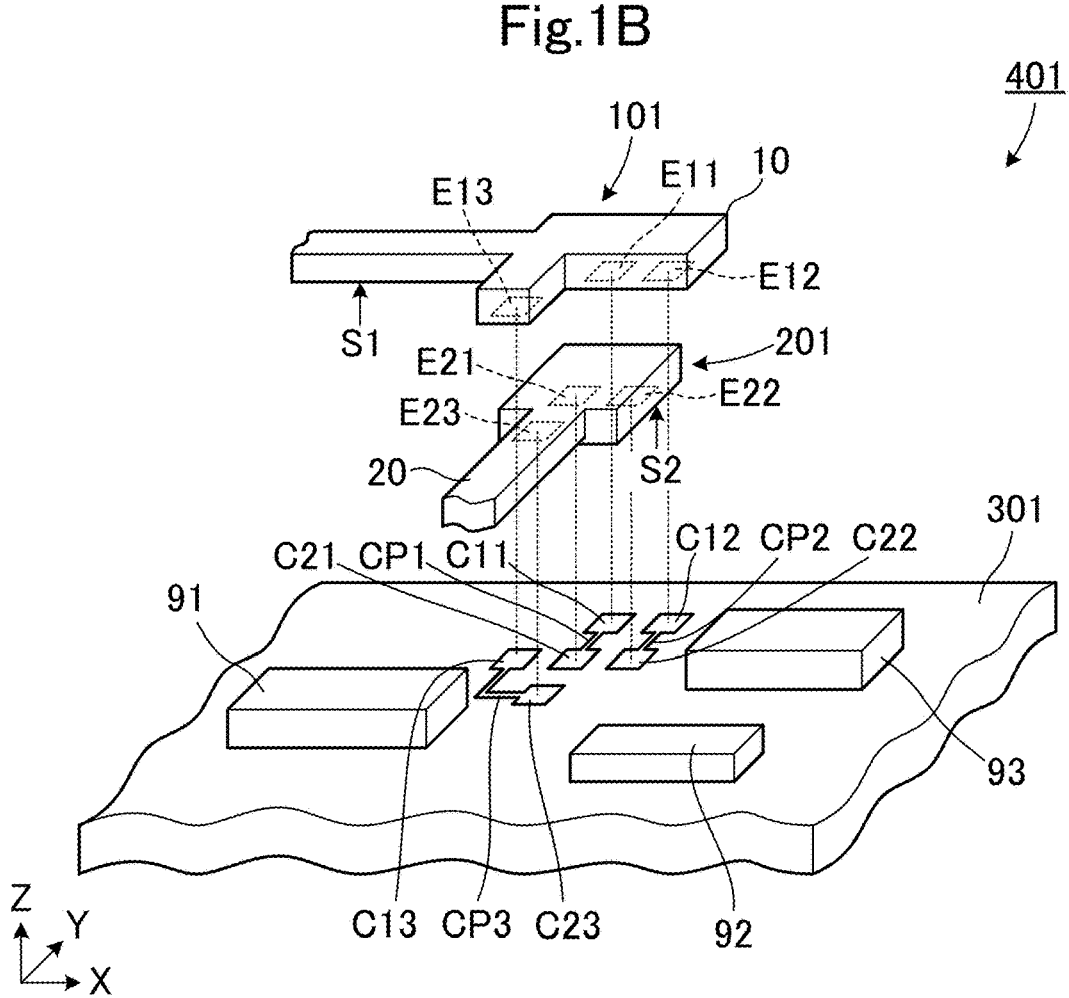
FIG. 1B is an exploded perspective view showing the main portion of the electronic device 401.
Figure 2A:
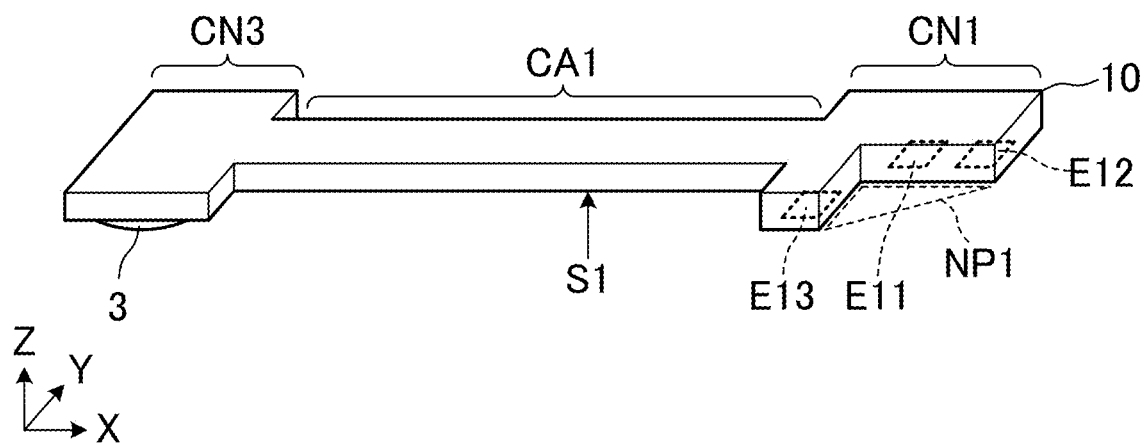
FIG. 2A is an external perspective view of a first element 101 according to the first preferred embodiment of the present invention.
Figure 2B:
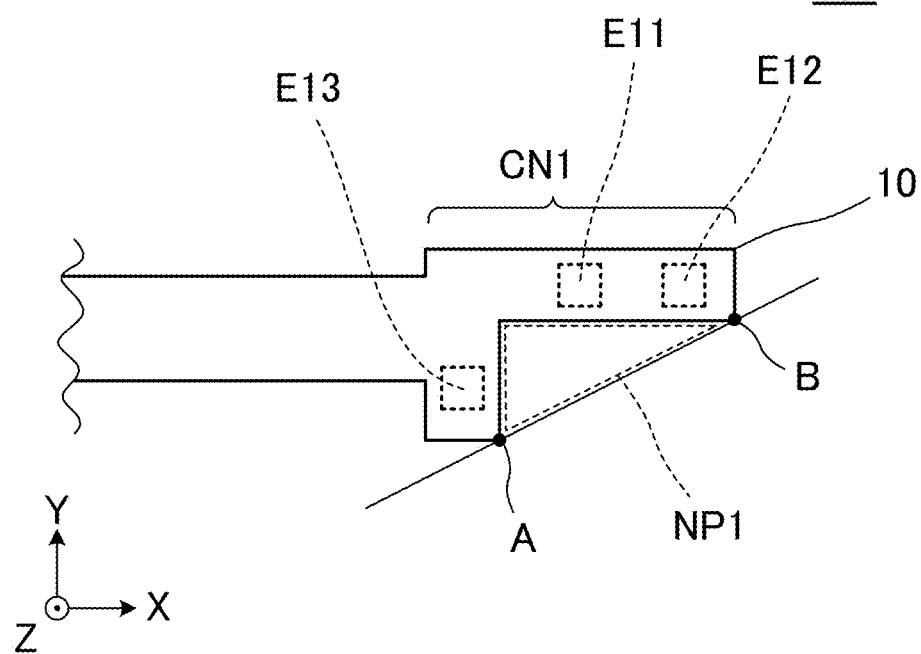
FIG. 2B is a plan view showing the first connection portion CN1 of the first element 101.
Figure 3:
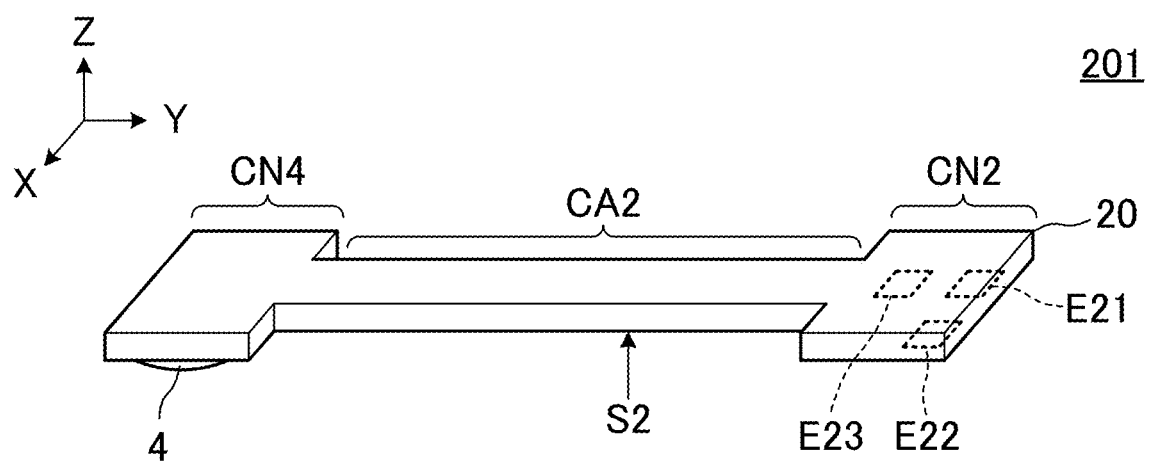
FIG. 3 is an external perspective view of a second element 201 according to the first preferred embodiment of the present invention.

FIG. 1A is an external perspective view showing the main portion of an electronic device 401 according to a first preferred embodiment of the present invention, and FIG. 1B is an exploded perspective view showing the main portion of the electronic device 401. FIG. 2A is an external perspective view of the first element 101 according to the first preferred embodiment, and FIG. 2B is a plan view showing the first connection portion CN1 of the first element 101. FIG. 3 is an external perspective view of the second element 201 according to the first preferred embodiment. In FIGS. 1A and 1B, for the purpose of facilitating understanding of the configuration, only the portions at which the first connection portion CN1 of the first element 101 and the second connection portion CN2 of the second element are joined to the surface of a circuit board 301 are illustrated.

The electronic device 401 includes a circuit board 301, a first element 101 including a first surface S1, a second element 201 including a second surface S2, surface mounted components 91, 92, and 93, and other suitable structure.

As shown in FIGS. 1A and 1B, at least a portion of each of the first element 101 and the second element 201 is joined to the surface of the circuit board 301. The surface mounted components 91, 92, and 93 are mounted on the surface of the circuit board 301. Note that although not shown in FIGS. 1A and 1B, elements other than the first element 101, the second element 201, and the surface mounted components 91, 92, and 93 are also mounted on the circuit board 301.

As shown in FIG. 2A, the first element 101 preferably has an elongated shape whose longitudinal direction coincides with an X-axis direction. The first element 101 includes a first connection portion CN1, a third connection portion CN3, a first transmission line portion CA1, a connector 3, a first signal electrode E11, and first ground electrodes E12 and E13.

The first connection portion CN1, including a right-angled triangular first recess portion NP1, is preferably, for example, an L-shaped portion to be joined to the surface of the circuit board 301. The second connection portion CN2 is preferably a rectangular or substantially rectangular portion to be connected to another circuit. The first transmission line portion CA1 extends in the X-axis direction and connects the first connection portion CN1 and the third connection portion CN3 to each other.

The "first recess portion" refers to a portion that is recessed inward as compared to a straight line passing through any two points of the first connection portion CN1 in plan view of the first element (as viewed from a Z-axis direction). Specifically, the first recess portion NP1 is recessed inward as compared to a straight line passing through a point A and a point B shown in FIG. 2B.

The first signal electrode E11 and the first ground electrodes E12 and E13 are exposed to the first surface S1 of the first connection portion CN1, and the connector 3 is provided on the first surface S1 of the third connection portion CN3.

In the present preferred embodiment, the first signal electrode E11 and the first ground electrodes E12 and E13 correspond to "a plurality of first connection portion side electrodes".

As shown in FIG. 3, the second element 201 preferably has an elongated shape whose longitudinal direction coincides with a Y-axis direction. The second element 201 includes a second connection portion CN2, a fourth connection portion CN4, a second transmission line portion CA2, a connector 4, a second signal electrode E21, and second ground electrodes E22 and E23.

The second connection portion CN2 is preferably a rectangular or substantially rectangular portion to be joined to the surface of the circuit board 301. The fourth connection portion CN4 is preferably a rectangular or substantially rectangular portion to be connected to another circuit. The second transmission line portion CA2 extends in the Y-axis direction and connects the second connection portion CN2 and the fourth connection portion CN4 to each other.

The second signal electrode E21 and the second ground electrodes E22 and E23 are exposed to the second surface S2 of the second connection portion CN2, and the connector 4 is provided on the second surface S2 of the fourth connection portion CN4.

In the present preferred embodiment, the second signal electrode E21 and the second ground electrodes E22 and E23 correspond to "a plurality of second connection portion side electrodes".

As shown in FIG. 1B, the circuit board 301 includes a first signal conductor pattern C11, a second signal conductor pattern C21, first ground conductor patterns C12 and C13, second ground conductor patterns C22 and C23, a plurality of electrode connection patterns CP1, CP2, and CP3, and other suitable structure.

The first signal conductor pattern C11, the second signal conductor pattern C21, the first ground conductor patterns C12 and C13, and the second ground conductor patterns C22 and C23 are electrodes provided on the surface of the circuit board 301. The electrode connection patterns CP1, CP2, and CP3 are provided on the surface of the circuit board 301.

In the present preferred embodiment, the first signal conductor pattern C11 and the first ground conductor patterns C12 and C13 correspond to "a plurality of first board side electrodes".

In the present preferred embodiment, the second signal conductor pattern C21 and the second ground conductor patterns C22 and C23 correspond to "a plurality of second board side electrodes".

The electrode connection pattern CP1 connects the first signal conductor pattern C11 and the second signal conductor pattern C21 to each other. The electrode connection pattern CP2 connects the first ground conductor pattern C12 and the second ground conductor pattern C22 to each other. The electrode connection pattern CP3 connects the first ground conductor pattern C13 and the second ground conductor pattern C23 to each other.

Figure 4:
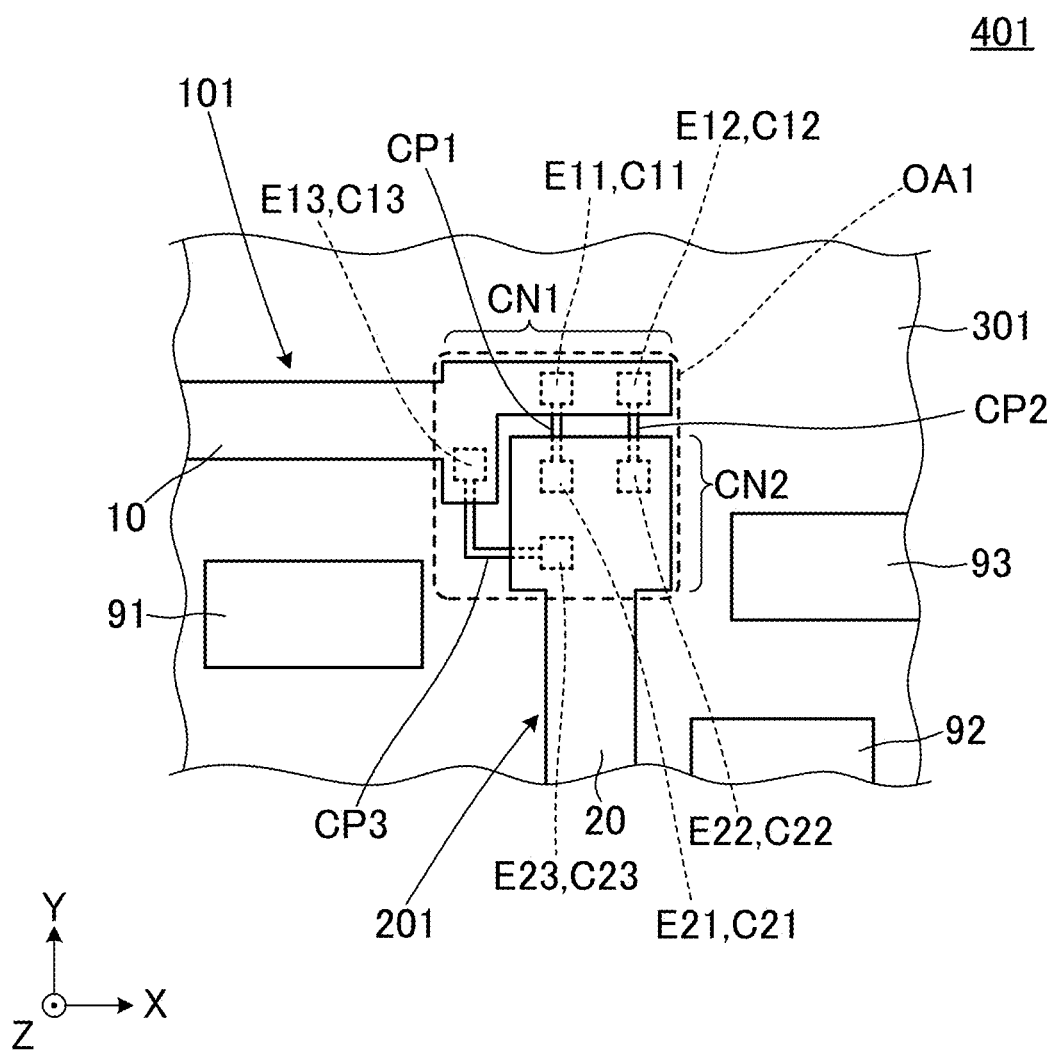
FIG. 4 is a plan view showing the main portion of the electronic device 401.

FIG. 4 is a plan view showing the main portion of the electronic device 401.

As shown in FIGS. 1A, 1B, and 4, for example, the first connection portion CN1 of the first element 101 and the second connection portion CN2 of the second element 201 are each joined to the surface of the circuit board 301. Specifically, the plurality of first connection portion side electrodes (the first signal electrode E11 and the first ground electrodes E12 and E13) and the plurality of first board side electrodes (the first signal conductor pattern C11 and the first ground conductor patterns C12 and C13) are opposed to each other, and are each joined with a conductive joining material, such as solder, for example. The plurality of second connection portion side electrodes (the second signal electrode E21 and the second ground electrodes E22 and E23) and the plurality of second board side electrodes (the second signal conductor pattern C21 and the second ground conductor patterns C22 and C23) are opposed to each other, and are each joined with a conductive joining material, such as solder, for example.

Accordingly, the first signal electrode E11 is electrically connected to the second signal electrode E21 via the first signal conductor pattern C11, the electrode connection pattern CP1, and the second signal conductor pattern C21. The first ground electrode E12 is electrically connected to the second ground electrode E22 via the first ground conductor pattern C12, the electrode connection pattern CP2, and the second ground conductor pattern C22. The first ground electrode E13 is electrically connected to the second ground electrode E23 via the first ground conductor pattern C13, the electrode connection pattern CP3, and the second ground conductor pattern C23.

As shown in FIG. 4, the plurality of first connection section side electrodes (the first signal electrode E11 and the first ground electrodes E12 and E13) and the plurality of first board side electrodes (the first signal conductor pattern C11 and the first ground conductor patterns C12 and C13) are each disposed along the first recess portion (the first recess portion NP1 shown in FIGS. 2A and 2B) in plan view of the circuit board (viewed from the Z-axis direction). The plurality of first board side electrodes and the plurality of second board side electrodes (the second signal conductor pattern C21 and the second ground conductor patterns C22 and C23) are respectively disposed at positions opposed to each other as viewed from the Z-axis direction.

Here, "disposed at positions opposed to each other" means that no other electrode or no other conductor pattern is disposed between the electrodes connected to each other with the electrode connection pattern in plan view of the circuit board. That is, it is not necessary to provide an electrode connection pattern that detours so as to avoid another electrode or another conductor pattern, and the electrodes are disposed at positions at which they can be connected with a linear electrode connection pattern.

As shown in FIG. 4, at least portions of the plurality of second connection portion side electrodes and the plurality of second board side electrodes (the second signal electrode E21 and the second signal conductor pattern C21) overlap the first recess portion (NP1) as viewed from the Z-axis direction. Furthermore, the plurality of second connection portion side electrodes and the plurality of second board side electrodes are disposed along the first recess portion (NP1) as viewed from the Z-axis direction.

Figure 5:
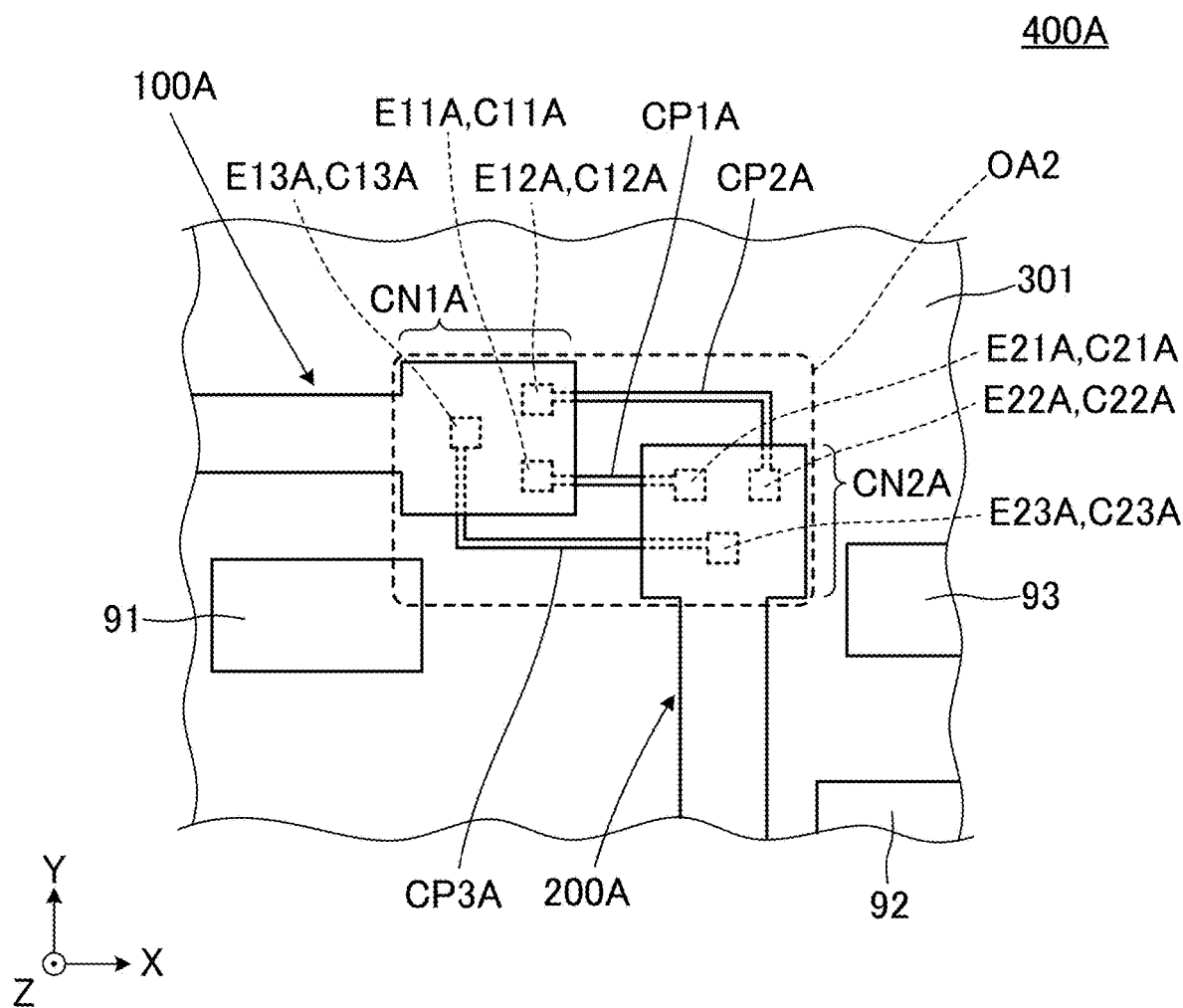
FIG. 5 is a plan view showing a main portion of an electronic device 400A of a comparative example.

Next, advantages of the structure according to the present preferred embodiment will be described with reference to some comparative examples. FIG. 5 is a plan view showing the main portion of an electronic device 400A of a comparative example.

The electronic device 400A includes a first element 100A, a second element 200A, and the circuit board 301. The electronic device 400A is an example in which the first connection portion and the second connection portion that do not include a recess portion are connected with an electrode and an electrode connection pattern that are provided on the circuit board 301.

The first element 100A includes a first connection portion CN1A, a plurality of first connection portion side electrodes (a first signal electrode E11A and first ground electrodes E12A and E13A), and other suitable structure. The first element 100A differs from the first element 101 in the structure of the first connection portion CN1A and the arrangement of the plurality of first connection portion side electrodes. The remaining structure is the same or substantially the same as that of the first element 101.

The first connection portion CN1A is a rectangular or substantially rectangular portion and does not include a recess portion. The plurality of first connection portion side electrodes are disposed along the outer shape of the first connection portion CN1A. The plurality of first connection portion side electrodes are joined to a plurality of first board side electrodes (a first signal conductor pattern C11A and first ground conductor patterns C12A and C13A) provided on the circuit board 301 with a conductive joining material.

The second element 200A includes a second connection portion CN2A, a plurality of second connection portion side electrodes (a second signal electrode E21A and second ground electrodes E22A and E23A), and other suitable structure. The second element 200A differs from the second element 201 according to the present preferred embodiment in the shape of the second connection portion CN2A and the arrangement of the second signal electrode E21A and the second ground electrodes E22A and E23A. The remaining structure is the same or substantially the same as that of the second element 201.

The plurality of second connection portion side electrodes are disposed along the outer shape of the second connection portion CN2A. The plurality of second connection portion side electrodes are joined to a plurality of second board side electrodes (a second signal conductor pattern C21A and second ground conductor patterns C22A and C23A) provided on the circuit board 301 with a conductive joining material.

As shown in FIG. 5, the plurality of first board side electrodes and the plurality of second board side electrodes are respectively connected to each other with a plurality of electrode connection patterns CP1A, CP2A, and CP3A provided on the circuit board 301. The electrode connection pattern CP1A is a linear conductor pattern connecting the first signal conductor pattern C11A and the second signal conductor pattern C21A to each other. The electrode connection pattern CP2A is preferably, for example, an L-shaped conductor pattern configured so as to detour other conductor patterns and connecting the first ground conductor pattern C12A and the second ground conductor pattern C22A to each other. The electrode connection pattern CP3A is preferably, for example, an L-shaped conductor pattern configured so as to detour other conductor patterns and connecting the first ground conductor pattern C13A and the second ground conductor pattern C23A to each other.

In the electronic device 400A of the comparative example, the electrode connection pattern is configured so as to detour other conductor patterns, and thus, the footprint necessary to connect between the first connection portion CN1A and the second connection portion CN2A (the area in which the area of the first connection portion joined to the circuit board, the area of the second connection portion joined to the circuit board, and the area of the plurality of electrode connection patterns formed on the circuit board are brought together) is large (see the footprint OA2 shown in FIG. 5).

On the other hand, in the electronic device 401 according to the present preferred embodiment, as shown in FIG. 4, the plurality of first connection portion side electrodes and the plurality of first board side electrodes are each disposed along the first recess portion (NP1) as viewed from the Z-axis direction. The plurality of first board side electrodes and the plurality of second board side electrodes are respectively disposed at positions opposed to each other as viewed from the Z-axis direction. In this structure, it is not necessary to provide the plurality of electrode connection patterns CP1, CP2, and CP3 so as to detour other electrodes or other conductor patterns, and it is thus, possible to shorten the line lengths of the plurality of electrode connection patterns CP1, CP2, and CP3, compared to a case of providing a plurality of electrode connection patterns so as to detour other electrodes or other conductor patterns. Accordingly, this structure enables the footprint necessary to connect between the first connection portion CN1 and the second connection portion CN2 to be reduced and enables conductor loss to be reduced (see the footprint OA1 shown in FIG. 4).

In the present preferred embodiment, as shown in FIG. 4, at least portions of the plurality of second connection portion side electrodes and the plurality of second board side electrodes (the second signal electrode E21 and the second signal conductor pattern C21) overlap the first recess portion (NP1) as viewed from the Z-axis direction. According to this structure, it is possible to further shorten the line length of the electrode connection pattern connecting between the first board side electrode and the second board side electrode (or between the first connection portion side electrode and the second connection portion side electrode). Accordingly, the footprint necessary to connect between the first connection portion CN1 and the second connection portion CN2 further decreases and the conductor loss is able to be further reduced.

In the present preferred embodiment, the plurality of first connection portion side electrodes and the plurality of second connection portion side electrodes are disposed along the first recess portion (NP1) as viewed from the Z-axis direction. In the present preferred embodiment, the plurality of first board side electrodes and the plurality of second board side electrodes are disposed along the first recess portion (NP1) as viewed from the Z-axis direction.

According to this structure, as compared to a case in which the second connection portion side electrode and the second board side electrode are not disposed along the first recess portion (NP1) as viewed from the Z-axis direction, it becomes easy to ensure the distance (isolation) between the plurality of first connection portion side electrodes, between the plurality of second connection portion side electrodes, between the plurality of first board side electrodes, and between the plurality of second board side electrodes, thus facilitating the design of the characteristic impedance. Further, since the distance between the plurality of electrode connection patterns is able to be easily ensured, it is not necessary to narrow the line widths of the plurality of electrode connection patterns, and the conductor loss of the electrode connection patterns does not increase.

Figure 6:
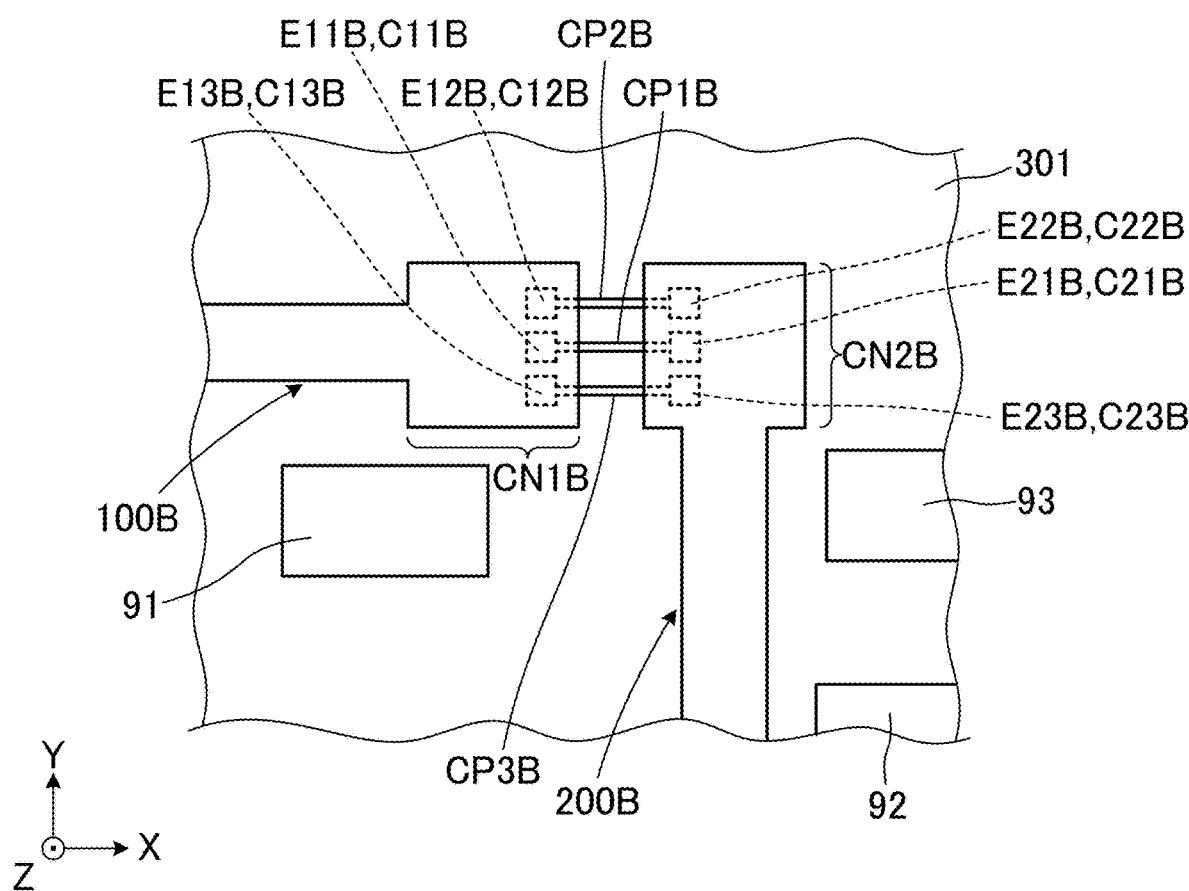
FIG. 6 is a plan view showing a main portion of an electronic device 400B of another comparative example.

FIG. 6 is a plan view showing the main portion of an electronic device 400B of another comparative example.

The electronic device 400B includes a first element 100B, a second element 200B, and a circuit board 301. The electronic device 400B is an example in which the first connection portion of the first element 100B (the first connection portion side electrode) and the second connection portion of the second element 200B (the second connection portion side electrode) are connected in the shortest distance.

The first element 100B includes a first connection portion CN1B, a plurality of first connection portion side electrodes (a first signal electrode E11B and first ground electrodes E12B and E13B), and other suitable structure. The first element 100B differs from the first element 101 in the structure of the first connection portion CN1B and the arrangement of the plurality of first connection portion side electrodes. The remaining structure is the same or substantially the same as that of the first element 101.

The first connection portion CN1B is a rectangular or substantially rectangular portion and does not include a recess portion. The plurality of first connection portion side electrodes are disposed in the vicinity of the first side of the first connection portion CN1B (the right side of the first connection portion CN1B in FIG. 6) and aligned along one direction (the Y-axis direction). The plurality of first connection portion side electrodes are joined to a plurality of first board side electrodes (a first signal conductor pattern C11B and first ground conductor patterns C12B and C13B) provided on the circuit board 301 with a conductive joining material.

The second element 200B includes a second connection portion CN2B, a plurality of second connection portion side electrodes (a second signal electrode E21B and second ground electrodes E22B and E23B), and other suitable structure. The second element 200B differs from the second element 201 according to the present preferred embodiment in the shape of the second connection portion CN2B and the arrangement of the plurality of second connection portion side electrodes. The remaining structure is the same or substantially the same as that of the second element 201.

The plurality of second connection portion side electrodes are disposed in the vicinity of the second side of the second connection portion CN2B (the left side of the second connection portion CN2B in FIG. 6) and aligned along one direction (the Y-axis direction). The plurality of second connection portion side electrodes are joined to a plurality of second board side electrodes (a second signal conductor pattern C21B and second ground conductor patterns C22B and C23B) provided on the circuit board 301 with a conductive joining material.

As shown in FIG. 6, the plurality of first board side electrodes and the plurality of second board side electrodes are connected to each other in the shortest distance with a plurality of linear electrode connection patterns CP1B, CP2B, and CP3B that extend in another direction (the X-axis direction). The plurality of electrode connection patterns CP1B, CP2B, and CP3B are aligned in one direction (the Y-axis direction).

In a case of connecting the first connection portion CN1B and the second connection portion CN2B in the shortest distance as in the electronic device 400B of another comparative example, the arrangement of the plurality of electrodes (the plurality of first connection portion side electrodes, the plurality of second connection portion side electrodes, the plurality of first board side electrodes, and the plurality of second board side electrodes), the shape of the plurality of electrode connection patterns, and other arrangements are limited to such a structure, and thus, the degree of design freedom is low. In addition, since the plurality of electrodes or the plurality of electrode connection patterns are aligned in the same direction (for example, the Y-axis direction), the distance between the signal conductor and the ground conductor (the plurality of electrodes and the plurality of electrode connection patterns) is so close that the design of characteristic impedance may become difficult. Conversely, in a case of thinning the line widths of the plurality of electrode connection patterns (the signal electrode connection patterns and the ground electrode connection patterns) and separating the distances between the plurality of electrode connection patterns in order to maintain the characteristic impedance, the conductor loss of the electrode connection pattern increases.

On the other hand, in the electronic device 401 according to the present preferred embodiment, as described above, the plurality of electrodes (the first connection portion side electrode, the second connection portion side electrode, the first board side electrode, and the second board side electrode) are each disposed along the first recess portion NP1 as viewed from the Z-axis direction, and it thus, becomes easy to ensure the distance (isolation) between the plurality of electrodes or a plurality of electrode connection patterns, so as to facilitate the design of the characteristic impedance. In this structure, it is easy to ensure the distance between the plurality of electrode connection patterns, and thus, it is not necessary to thin the line widths of the plurality of electrode connection patterns, and the conductor loss of the electrode connection patterns does not increase.

In the present preferred embodiment, the width of the first connection portion CN1 in the width direction (the direction orthogonal or substantially orthogonal to the extending direction (the Y-axis direction in the present preferred embodiment)) of the first transmission line portion CA1 is thicker than the width of the first transmission line portion CA1. Therefore, the degree of freedom of the shape of first recess portion NP1 provided in the first connection portion CN1 is able to be improved, and the distance (isolation) between the first connection portion side electrodes (the first signal electrode E11 and the first ground electrodes E12 and E13) is able to be further easily ensured.

Figure 7A:
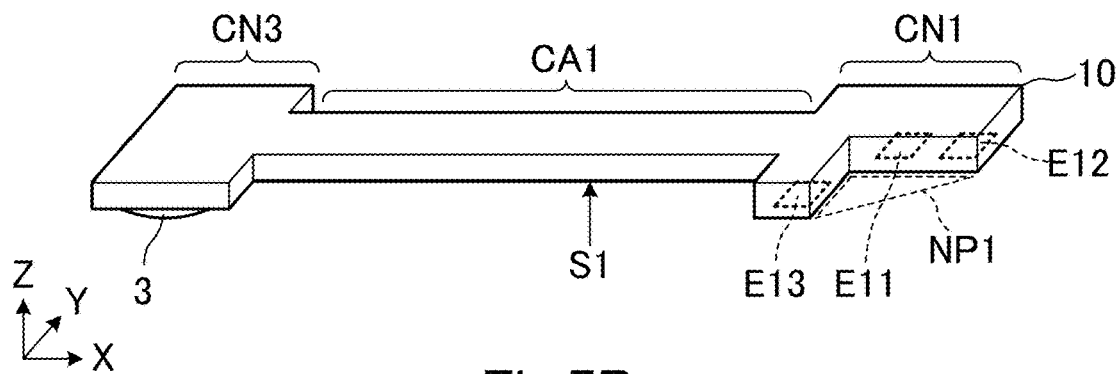
FIG. 7A is an external perspective view of the first element 101 according to the first preferred embodiment of the present invention.

The first element 101 according to the present preferred embodiment preferably has, for example, the following configuration. FIG. 7A is an external perspective view of the first element 101 according to the first preferred embodiment, and FIG. 7B is an exploded plan view of the first element 101.

As shown in FIG. 7A, the first element 101 includes a first base material 10 and conductor patterns (to be described in detail later) provided on the first base material 10. The first base material 10 is preferably, for example, a flexible base material having a permittivity lower than that of the circuit board (301) to which the first element 101 is joined, and the first base material 10 is elastically or plastically deformed by an external force.

Figure 7B:
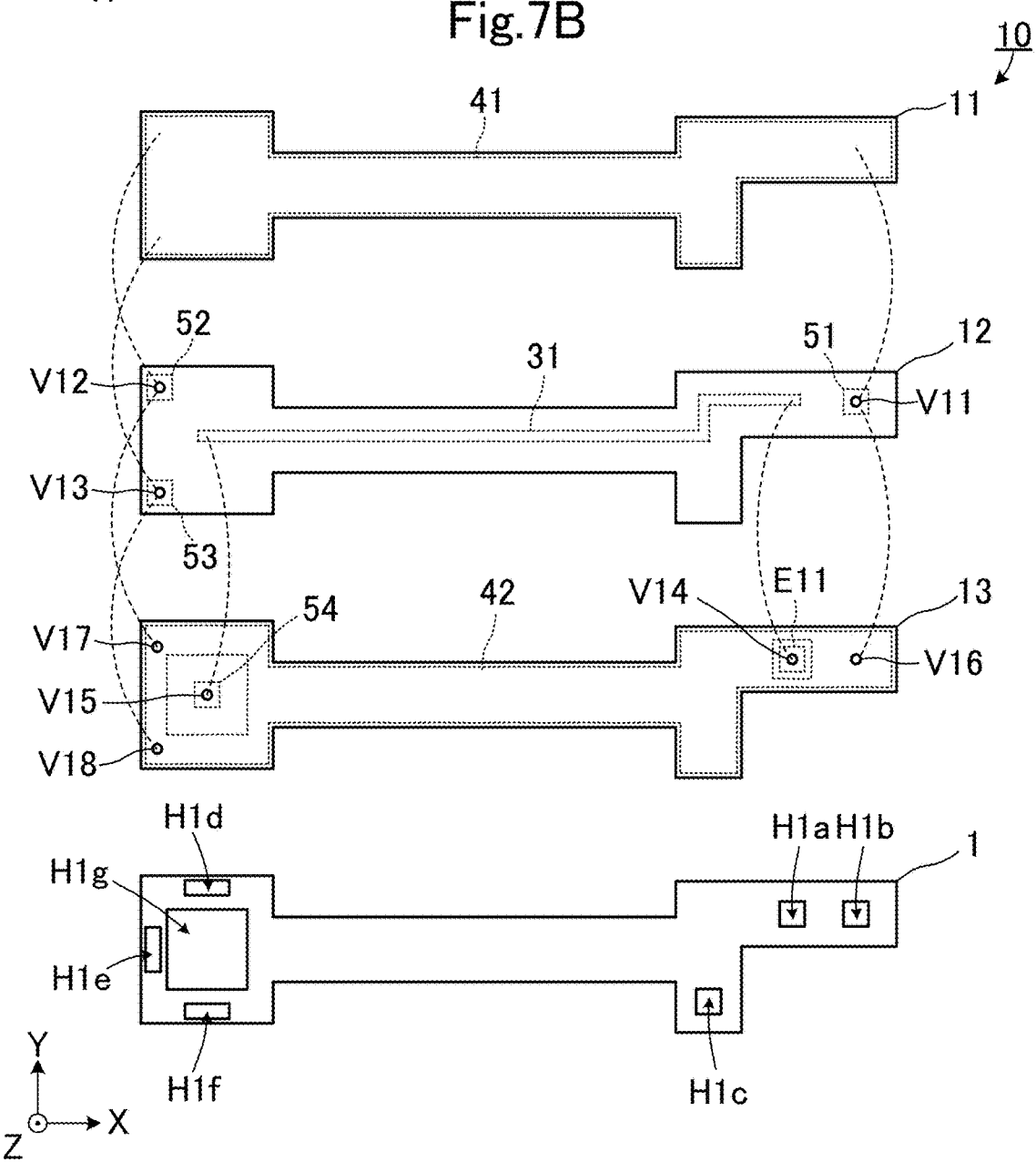
FIG. 7B is an exploded plan view of the first element 101.

As shown in FIG. 7B, the first base material 10 is provided by sequentially laminating a plurality of insulating base material layers 11, 12, and 13 and a protective layer 1. Each of the plurality of insulating base material layers 11, 12, and 13 is a flexible flat plate whose longitudinal direction coincides with the X-axis direction. The plurality of insulating base material layers 11, 12, and 13 are preferably, for example, liquid crystal polymer sheets, and the first base material 10 is preferably, for example, a laminate of the liquid crystal polymer sheets. The protective layer 1 is preferably, for example, a solder resist film, a coverlay film, or other layer. The various conductor patterns are preferably provided by, for example, patterning a copper foil attached to the liquid crystal polymer sheet.

A first ground conductor 41 is provided on the back surface of the insulating base material layer 11. The first ground conductor 41 is provided on the entire or substantially the entire surface of the insulating base material layer 11.

A first signal conductor 31 and three conductor patterns 51, 52, and 53 are provided on the back surface of the insulating base material layer 12. The first signal conductor 31 is a linear conductor pattern extending in the longitudinal direction (the X-axis direction) of an insulating base material layer 12. The conductor pattern 51 is preferably, for example, a rectangular or substantially rectangular conductor pattern provided in the vicinity of a first end of the insulating base material layer 12 (the right end of the insulating base material layer 12 in FIG. 7B). The conductor patterns 52 and 53 are preferably, for example, rectangular or substantially rectangular conductor patterns provided in the vicinity of a second end of the insulating base material layer 12 (the left end of the insulating base material layer 12 in FIG. 7B).

In the insulating base material layer 12, three interlayer connection conductors V11, V12, and V13 are provided. The interlayer connection conductor V11 is disposed in the vicinity of the first end of the insulating base material layer 12 and connected to the first ground conductor 41 and the conductor pattern 51. The interlayer connection conductor V12 is disposed in the vicinity of the second end of the insulating base material layer 12 and connected to the first ground conductor 41 and the conductor pattern 52. The interlayer connection conductor V13 is disposed in the vicinity of the second end of the insulating base material layer 12 and connected to the first ground conductor 41 and the conductor pattern 53.

On the back surface of the insulating base material layer 13, a first ground conductor 42, the first signal electrode E11, and a conductor pattern 54 are provided. The first ground conductor 42 is provided on the entire or substantially the entire surface of the insulating base material layer 13 and includes an opening at a position at which the first signal electrode E11 and the conductor pattern 54 are provided. The first signal electrode E11 is preferably, for example, a rectangular or substantially rectangular conductor pattern provided in the vicinity of a first end of the insulating base material layer 13 (the right end of the insulating base material layer 13 in FIG. 7B). The conductor pattern 54 is preferably, for example, a rectangular or substantially rectangular conductor pattern provided in the vicinity of a second end of the insulating base material layer 13 (the left end of the insulating base material layer 13 in FIG. 7B).

In the insulating base material layer 13, five interlayer connection conductors V14, V15, V16, V17, and V18 are provided. The interlayer connection conductor V14 is disposed in the vicinity of the first end of the insulating base material layer 13 and connected to one end of the first signal conductor 31 and the first signal electrode E11. The interlayer connection conductor V15 is disposed in the vicinity of the second end of the insulating base material layer 13 and connected to the other end of the first signal conductor 31 and the conductor pattern 54. That is, the first signal electrode E11 and the conductor pattern 54 are both electrically connected to the first signal conductor 31. The interlayer connection conductor V16 is disposed in the vicinity of the first end of the insulating base material layer 13 and connected to the conductor pattern 51 and the first ground conductor 42. The interlayer connection conductors V17 and V18 are disposed in the vicinity of the second end of the insulating base material layer 13 and connected to the conductor patterns 52 and 53 and the first ground conductor 42.

In the protective layer 1, a plurality of openings H1a, H1b, H1c, H1d, H1e, H1f, and H1g are provided. Due to the protective layer 1 provided on the surface of the insulating base material layer 13, the first signal electrode E11 provided on the insulating base material layer 13 is exposed from the opening H1a. Portions of the first ground conductor 42 provided on the insulating base material layer 13 are exposed from the openings H1b, H1c, H1d, H1e, and H1f. The portion of the first ground conductor 42 exposed from the opening H1b becomes the first ground electrode E12 shown in FIG. 7A, and the portion of the first ground conductor 42 exposed from the opening H1c becomes the first ground electrode E13 shown in FIG. 7A. Also, due to the protective layer 1 provided on the surface of the insulating base material layer 13, the conductor pattern 54 provided on the insulating base material layer 13 is exposed from the opening H1g. As shown in FIG. 2A, by mounting the connector 3 on the first surface S1 of the second connection portion CN2, the connector 3 is connected to the conductor pattern 54 and the portions of the first ground conductor 42 exposed from the openings H1d, H1e, and H1f.

The plurality of insulating base material layers 11, 12, and 13 and the protective layer 1 are laminated and heated and pressed, thus providing the first base material 10 in a state of being a collective board. Thereafter, the first base material 10 in the state of being a collective board is separated into pieces to obtain the first element 101. Note that the first recess portion NP1 shown in FIG. 7A is provided when the first base material 10 in the state of being a collective board is separated into pieces.

In this manner, the stripline first transmission line portion CA1 including the first signal conductor 31, the first ground conductors 41 and 42, the insulating base material layer 12 sandwiched by the first signal conductor 31 and the first ground conductor 41, and the insulating base material layer 13 sandwiched by the first signal conductor 31 and the first ground conductor 42 is provided. That is, the first transmission line portion CA1 of the first element 101 includes the first signal conductor 31 and the first ground conductors 41 and 42.

According to the first element 101 of the present preferred embodiment, the following advantageous effects are able to be obtained.

As shown in FIGS. 7A and 7B, in the first element 101, the first ground electrode E13 of the first connection portion CN1 is a partially exposed portion of the first ground conductor 42. For this reason, it is not necessary to provide an electrode specifically for the first ground electrode E13, and the conductor pattern provided on the first base material 10 is able to be simplified, thus enabling the first element 101 to be thinned.

The first base material 10 of the first element 101 has a permittivity lower than that of the circuit board (301) to which the first element 101 is joined. According to this structure, it is possible to reduce the capacitance generated between the first signal conductor 31 and the first ground conductors 41 and 42 shown in FIG. 7B. Therefore, the first element 101 is able to be thinned. According to this structure, dielectric loss when a high-frequency signal is transmitted to the first transmission line portion CA1 (the first signal conductor 31) is reduced or prevented, as compared to a case in which a high-frequency line portion is provided directly on the circuit board (301).

Figure 8A:
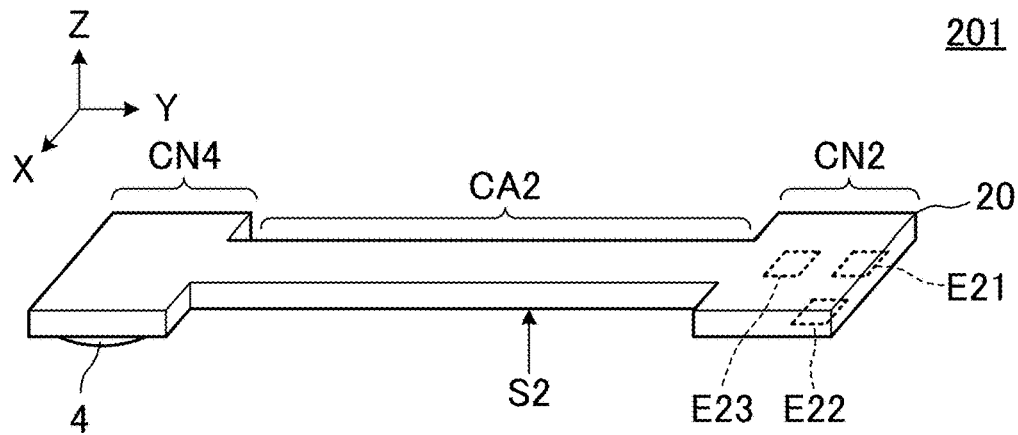
FIG. 8A is an external perspective view of the second element 201 according to the first preferred embodiment of the present invention.

The second element 201 according to the present preferred embodiment has, for example, the following configuration. FIG. 8A is an external perspective view of the second element 201 according to the first preferred embodiment, and FIG. 8B is an exploded plan view of the second element 201.

As shown in FIG. 8A, the second element 201 includes a second base material 20 and conductor patterns (to be described in detail later) provided on the second base material 20. The second base material 20 is preferably, for example a flexible base material having a permittivity lower than that of the circuit board (301) to which the second element 201 is joined, and the second base material 20 is elastically or plastically deformed by an external force.

Figure 8B:
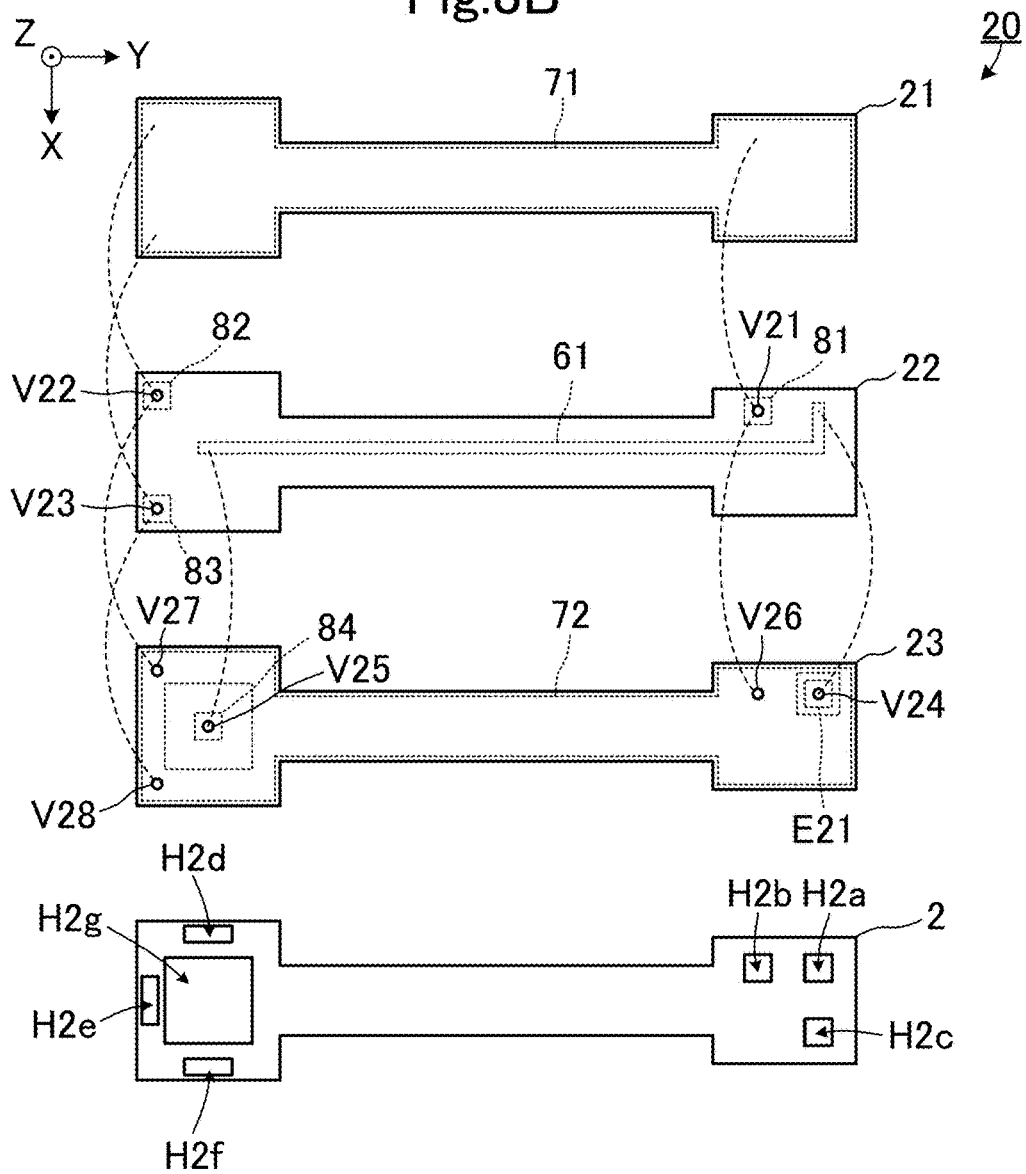
FIG. 8B is an exploded plan view of the second element 201.

As shown in FIG. 8B, the second base material 20 is provided by sequentially laminating a plurality of insulating base material layers 21, 22, and 23 and a protective layer 2. Each of the plurality of insulating base material layers 21, 22, and 23 is a flexible flat plate whose longitudinal direction coincides with the X-axis direction. The plurality of insulating base material layers 21, 22, and 23 are preferably, for example, liquid crystal polymer sheets, and the second base material 20 is preferably, for example, a laminate of the liquid crystal polymer sheets. The protective layer 2 is preferably, for example, a solder resist film, a coverlay film, or other suitable layer. The various conductor patterns are provided by, for example, patterning a copper foil attached to the liquid crystal polymer sheet.

A second ground conductor 71 is provided on the back surface of the insulating base material layer 21. The second ground conductor 71 is provided on the entire or substantially the entire surface of the insulating base material layer 21.

A second signal conductor 61 and three conductor patterns 81, 82, and 83 are provided on the back surface of the insulating base material layer 22. The second signal conductor 61 is a linear conductor pattern extending in the longitudinal direction (the X-axis direction) of the insulating base material layer 22. The conductor pattern 81 is preferably, for example, a rectangular or substantially rectangular conductor pattern provided in the vicinity of a third end of the insulating base material layer 22 (the right end of the insulating base material layer 22 in FIG. 8B). The conductor patterns 82 and 83 are preferably, for example, rectangular or substantially rectangular conductor patterns provided in the vicinity of a fourth end of the insulating base material layer 22 (the left end of the insulating base material layer 22 in FIG. 8B).

In the insulating base material layer 22, three interlayer connection conductors V21, V22, and V23 are provided. The interlayer connection conductor V21 is disposed in the vicinity of the third end of the insulating base material layer 22 and connected to the second ground conductor 71 and the conductor pattern 81. The interlayer connection conductor V22 is disposed in the vicinity of the fourth end of the insulating base material layer 22 and connected to the second ground conductor 71 and the conductor pattern 82. The interlayer connection conductor V23 is disposed in the vicinity of the fourth end of the insulating base material layer 22 and connected to the second ground conductor 71 and the conductor pattern 83.

On the back surface of the insulating base material layer 23, a second ground conductor 72, the second signal electrode E21, and a conductor pattern 84 are provided. The second ground conductor 72 is provided on the entire or substantially the entire surface of the insulating base material layer 23 and includes an opening at a position at which the second signal electrode E21 and the conductor pattern 84 are provided. The second signal electrode E21 is preferably, for example, a rectangular or substantially rectangular conductor pattern formed in the vicinity of a third end of the insulating base material layer 23 (the right end of the insulating base material layer 23 in FIG. 8B). The conductor pattern 84 is preferably, for example, a rectangular or substantially rectangular conductor pattern provided in the vicinity of a fourth end of the insulating base material layer 23 (the left end of the insulating base material layer 23 in FIG. 8B).

In the insulating base material layer 23, five interlayer connection conductors V24, V25, V26, V27, and V28 are provided. The interlayer connection conductor V24 is disposed in the vicinity of the third end of the insulating base material layer 23 and connected to one end of the second signal conductor 61 and the second signal electrode E21. The interlayer connection conductor V25 is disposed in the vicinity of the fourth end of the insulating base material layer 23 and connected to the other end of the second signal conductor 61 and the conductor pattern 84. That is, the second signal electrode E21 and the conductor pattern 84 are both electrically connected to the second signal conductor 61. The interlayer connection conductor V26 is disposed in the vicinity of the third end of the insulating base material layer 23 and connected to the second ground conductor 72 and the conductor pattern 81. The interlayer connection conductors V27 and V28 are disposed in the vicinity of the fourth end of the insulating base material layer 23 and connected to the conductor patterns 82 and 83 and the second ground conductor 72.

In the protective layer 2, a plurality of openings H2a, H2b, H2c, H2d, H2e, H2f, and H2g are provided. Due to the protective layer 2 provided on the surface of the insulating base material layer 23, the second signal electrode E21 provided on the insulating base material layer 23 is exposed from the opening H2a. Portions of the first ground conductor 72 provided on the insulating base material layer 23 are exposed from the openings H2b, H2c, H2d, H2e, and H2f. The portion of the second ground conductor 72 exposed from the opening H2b defines the second ground electrode E23 shown in FIG. 8A, and the portion of the second ground conductor 72 exposed from the opening H2c defines the second ground electrode E22 shown in FIG. 8A. The conductor pattern 84 provided on the insulating base material layer 23 is exposed from the opening H2g. As shown in FIG. 8A, by mounting the connector 4 on the second surface S2 of the fourth connection portion CN4, the connector 4 is connected to the conductor pattern 84 and the portions of the second ground conductor 72 exposed from the openings H2d, H2e, and H2f.

The plurality of insulating base material layers 21, 22, and 23 and the protective layer 2 are laminated and heated and pressed, thus providing the second base material 20 in a state of being a collective board. Thereafter, the second base material 20 in the state of being a collective board is separated into pieces to obtain the second element 201.

In this manner, the stripline second transmission line portion CA2 including the second signal conductor 61, the second ground conductors 71 and 72, the insulating base material layer 22 sandwiched by the second signal conductor 61 and the second ground conductor 71, and the insulating base material layer 23 sandwiched by the second signal conductor 61 and the second ground conductor 72 is provided. That is, the second transmission line portion CA2 of the second element 201 includes the second signal conductor 61 and the second ground conductors 71 and 72.

According to the second element 201 of the present preferred embodiment, the following advantageous effects are able to be obtained.

As shown in FIGS. 8A and 8B, in the second element 201, the second ground electrode E23 of the second connection portion CN2 is a partially exposed portion of the second ground conductor 72. For this reason, it is not necessary to provide an electrode specifically for the second ground electrode E23, and the conductor pattern provided on the second base material 20 is able to be simplified, thus enabling the second element 201 to be thinned.

The second base material 20 of the second element 201 has a permittivity lower than that of the circuit board (301) to which the second element 201 is joined. According to this structure, it is possible to reduce the capacitance generated between the second signal conductor 61 and the second ground conductors 71 and 72 shown in FIG. 8B. Therefore, the second element 201 is able to be thinned. According to this structure, dielectric loss when a high-frequency signal is transmitted to the second transmission line portion CA2 (the second signal conductor 61) is reduced or prevented, as compared to a case in which a high-frequency line portion is provided directly on the circuit board (301).

Second Preferred Embodiment

In regard to a second preferred embodiment of the present invention, an electronic device in which the third connection portion of the first element is joined to the surface of the circuit board and the fourth connection portion of the second element is joined to the surface of the circuit board is shown.

Figure 9A:
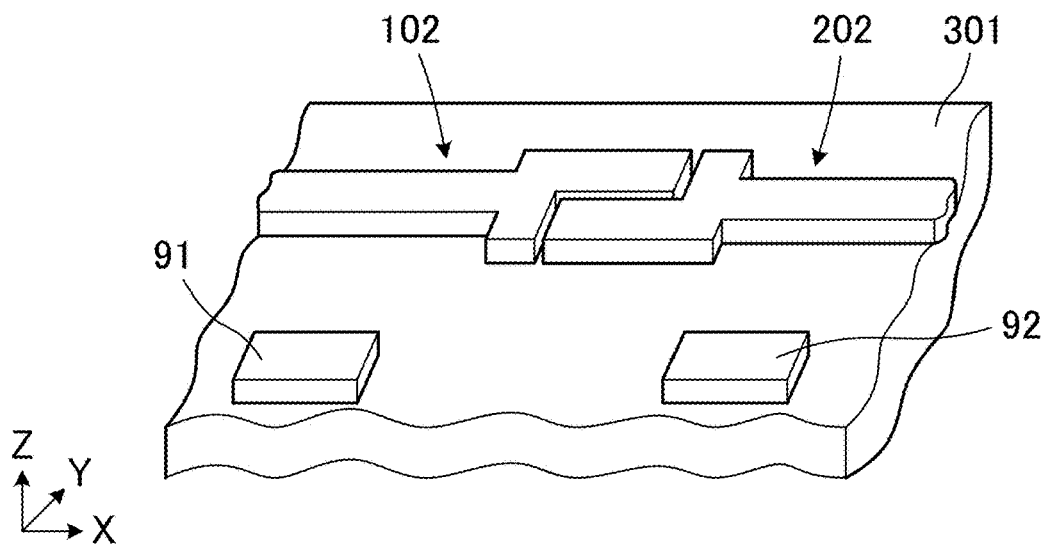
FIG. 9A is an external perspective view showing a main portion of an electronic device 402 according to a second preferred embodiment of the present invention.
Figure 9B:
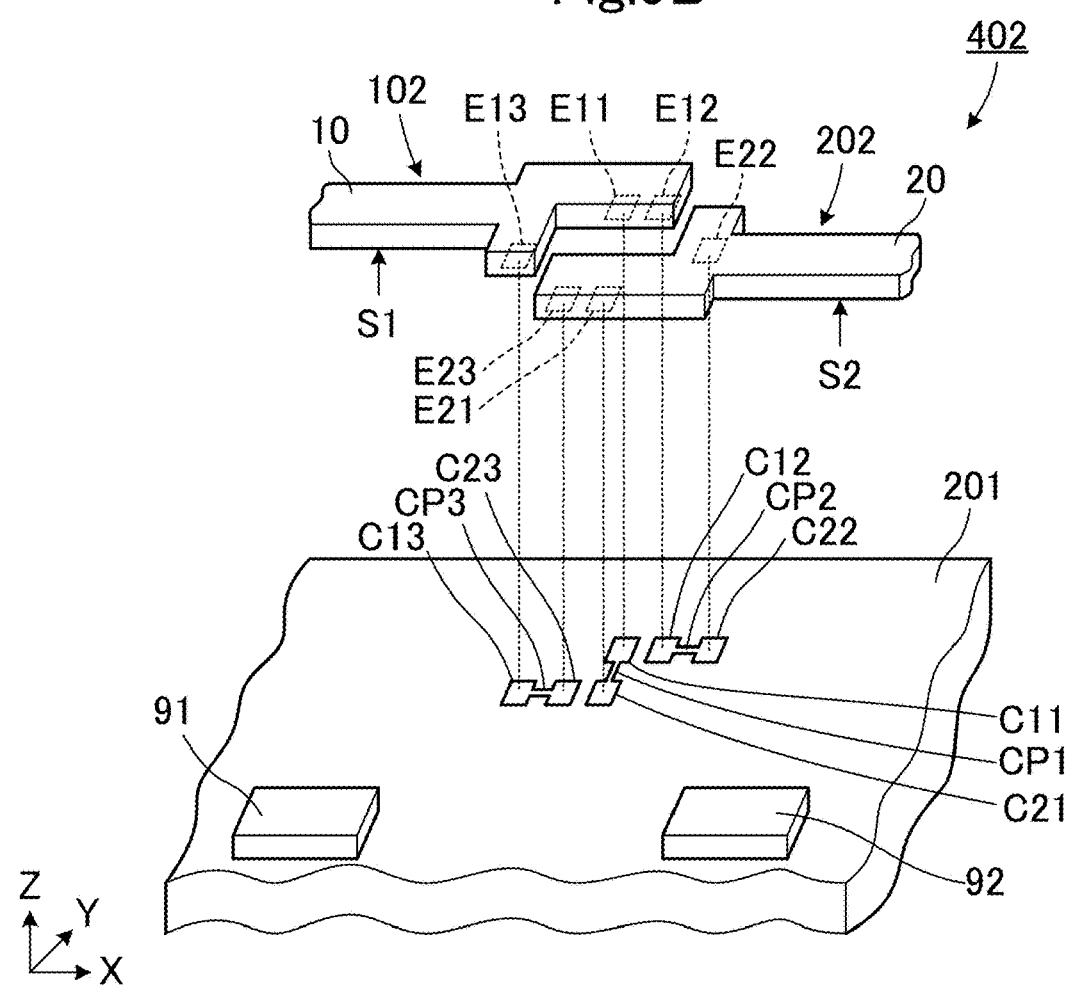
FIG. 9B is an exploded perspective view showing the main portion of the electronic device 402.
Figure 10A:
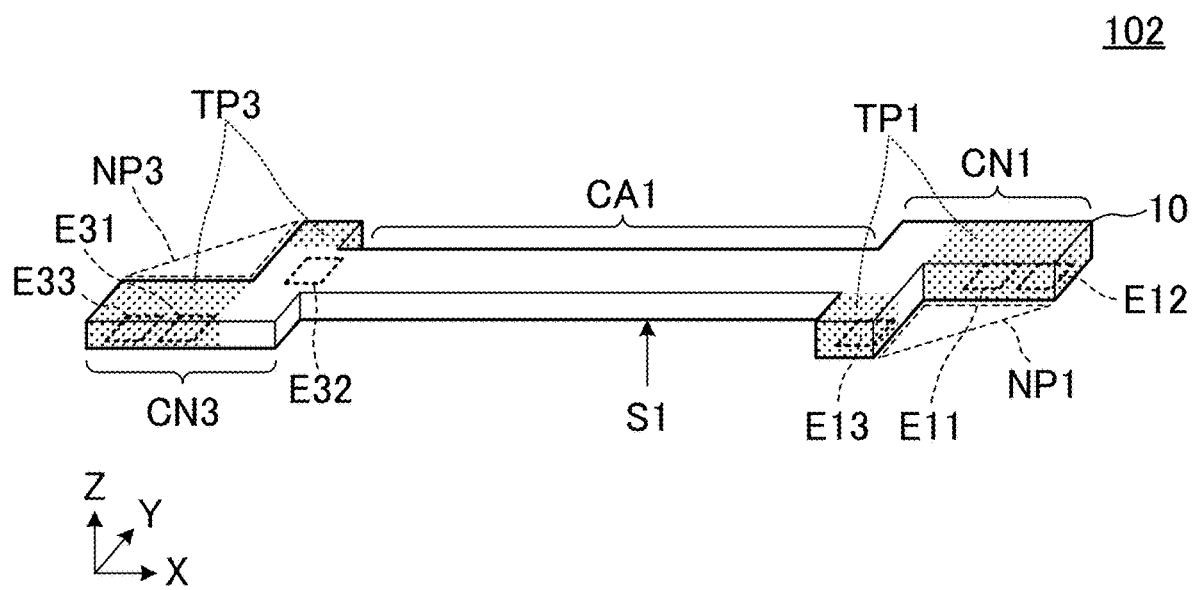
FIG. 10A is an external perspective view of a first element 102 according to the second preferred embodiment.
Figure 10B:
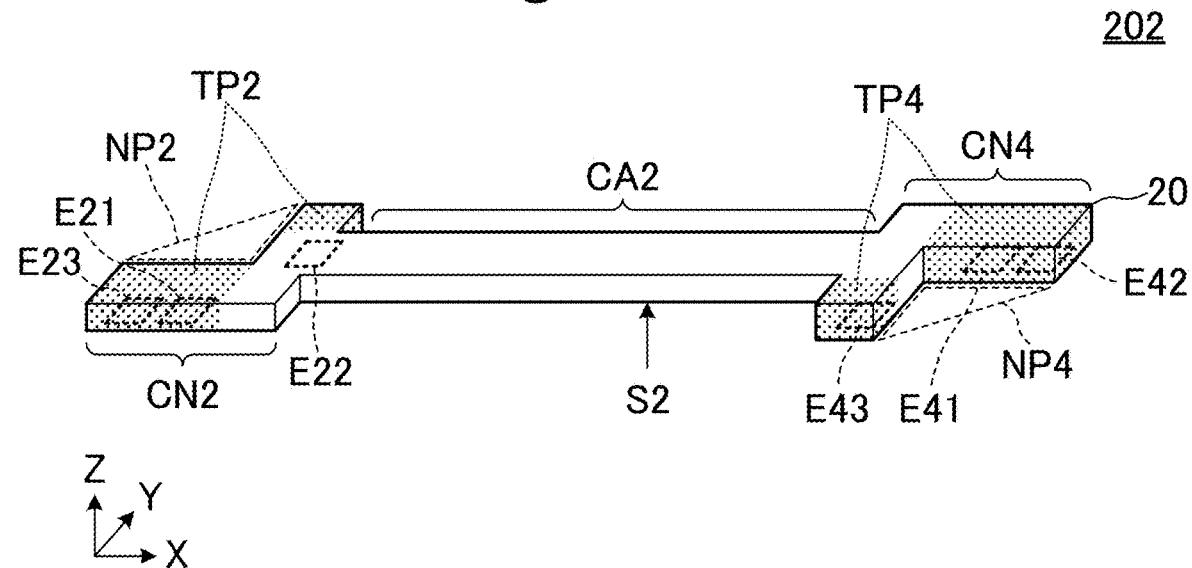
FIG. 10B is an external perspective view of a second element 202 according to the second preferred embodiment of the present invention.

FIG. 9A is an external perspective view showing the main portion of the electronic device 402 according to the second preferred embodiment, and FIG. 9B is an exploded perspective view showing the main portion of the electronic device 402. FIG. 10A is an external perspective view of the first element 102 according to the second preferred embodiment, and FIG. 10B is an external perspective view of the second element 202 according to the second preferred embodiment. Note that in FIG. 9A, illustration of an insulation joining material 5 is omitted. In FIG. 10A, a first narrow width portion TP1 and a third narrow width portion TP3 of the first element 102 are shown in a dot pattern, and in FIG. 10B, a second narrow width portion TP2 and a fourth narrow width portion TP4 of the second element 202 are shown in a dot pattern.

The electronic device 402 includes a circuit board 301, a first element 102 including a first surface S1, a second element 202 including a second surface S2, surface mounted components 91 and 92, an insulation joining material 5 (to be described in detail below), and other elements.

The first element 102 differs from the first element 101 according to the first preferred embodiment in the structure of the third connection portion CN3. The remaining structure is the same or substantially the same as that of the first element 101. The second element 202 differs from the second element 201 according to the first preferred embodiment in the structures of the second connection portion CN2 and the fourth connection portion CN4. The second element 202 differs from the second element 201 in that the longitudinal direction coincides with the X-axis direction. The remaining structure is the same or substantially the same as that of the second element 201.

Hereinafter, portions that are different from those of the electronic device 401 according to the first preferred embodiment will be described.

As shown in FIG. 10A, the first element 102 includes a first connection portion CN1, a third connection portion CN3, a first transmission line portion CA1, first signal electrodes E11 and E31, and first ground electrodes E12, E13, E32, and E33.

The first signal electrode E11 and the first ground electrodes E12 and E13 are exposed to the first surface S1 of the first connection portion CN1. The first signal electrode E31 and the first ground electrodes E32 and E33 are exposed to the first surface S1 of the third connection portion CN3.

In the present preferred embodiment, the first signal electrode E11 and the first ground electrodes E12 and E13 correspond to "a plurality of first connection portion side electrodes". In the present preferred embodiment, the first signal electrode E31 and the first ground electrodes E32 and E33 correspond to "a plurality of third connection portion side electrodes".

The first connection portion CN1 of the first element 102 is preferably, for example, an L-shaped portion including the right-angled triangular first recess portion NP1. The third connection portion CN3 is preferably, for example, an L-shaped portion having a right-angled triangular third recess portion NP3. Each of the width of the first connection portion CN1 in the width direction (the Y-axis direction) of the first transmission line portion CA1 and the width of the third connection portion CN3 in the width direction (the Y-axis direction) of the first transmission line portion CA1 is thicker than the width of the first transmission line portion CA1.

Note that the "third recess portion" refers to a portion that is recessed inward as compared to a straight line passing through any two points of the third connection portion CN3 in plan view of the first element (as viewed from the Z-axis direction).

As shown in FIG. 10B, the second element 202 includes a second connection portion CN2, a fourth connection portion CN4, a second transmission line portion CA2, second signal electrodes E21 and E41, and second ground electrodes E22, E23, E42, and E43.

The second signal electrode E21 and the second ground electrodes E22 and E23 are exposed to the second surface S2 of the second connection portion CN2. The second signal electrode E41 and the second ground electrodes E42 and E43 are exposed to the second surface S2 of the fourth connection portion CN4.

In the present preferred embodiment, the second signal electrode E21 and the second ground electrodes E22 and E23 correspond to "a plurality of second connection portion side electrodes". In the present preferred embodiment, the second signal electrode E41 and the second ground electrodes E42 and E43 correspond to "a plurality of fourth connection portion side electrodes".

The second connection portion CN2 of the second element 202 is preferably, for example, an L-shaped portion having a right-angled triangular second recess portion NP2, and the fourth connection portion CN4 of the second element 202 is preferably, for example, an L-shaped portion having a right-angled triangular fourth recess portion NP4. Each of the width of the second connection portion CN2 in the width direction (the Y-axis direction) of the second transmission line portion CA2 and the width of the fourth connection portion CN4 in the width direction (the Y-axis direction) of the second transmission line portion CA2 is thicker than the width of the second transmission line portion CA2.

The "second recess portion" refers to a portion that is recessed inward as compared to a straight line passing through any two points of the second connection portion CN2 in plan view of the second element (as viewed from the Z-axis direction). The "fourth recess portion" refers to a portion that is recessed inward as compared to a straight line passing through any two points of the fourth connection portion CN4 as viewed from the Z-axis direction.

The circuit board 301 further includes a plurality of third board side electrodes (not illustrated) and a plurality of fourth board side electrodes (not illustrated) in addition to the plurality of first board side electrodes (the first signal conductor pattern C11 and the first ground conductor patterns C12 and C13) and the plurality of second board side electrodes (the second signal conductor pattern C21 and the second ground conductor patterns C22 and C23).

As shown in FIGS. 10A and 10B, the first element 102 and the second element 202 according to the present preferred embodiment preferably have the same or substantially the same structure in shape, position of electrodes, and the like. That is, the first element 102 and the second element 202 have the same or substantially the same shape.

Figure 11A:
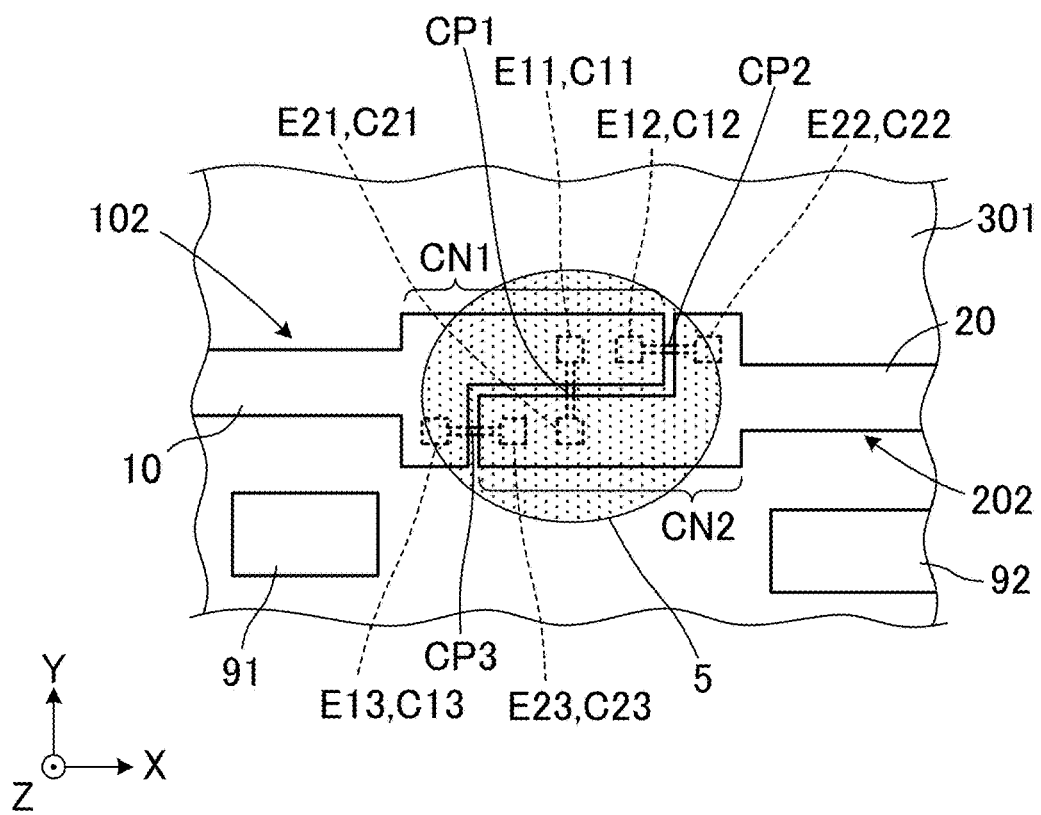
FIG. 11A is a plan view showing the main portion of the electronic device 402.
Figure 11B:
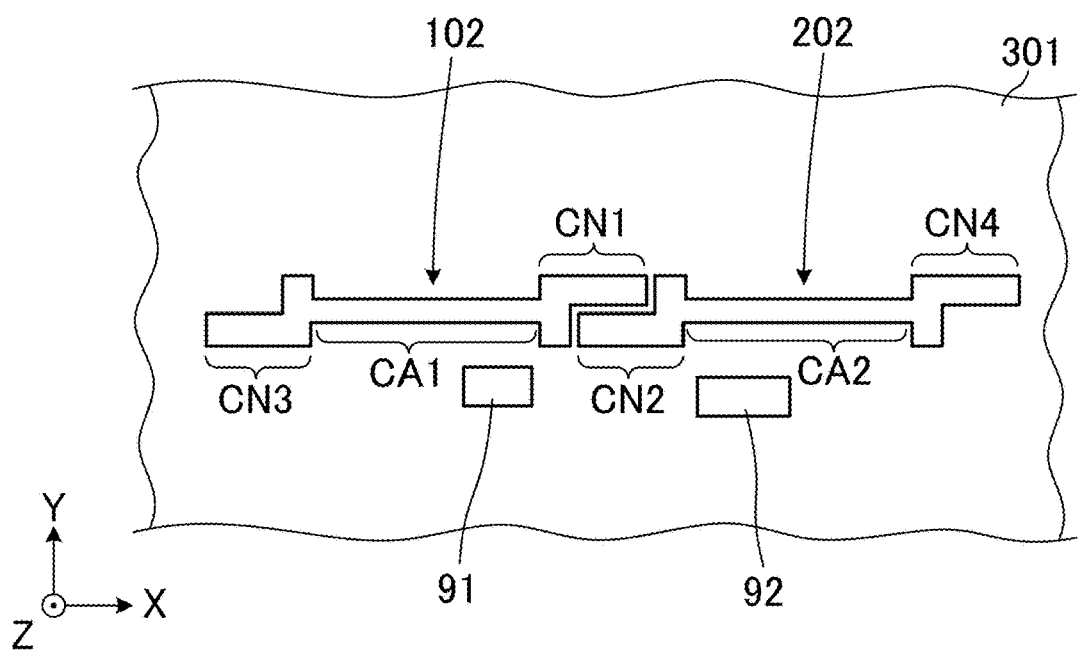
FIG. 11B is a plan view of the electronic device 402, showing the entire first element 102 and the entire second element 202.

FIG. 11A is a plan view showing the main portion of the electronic device 402, and FIG. 11B is a plan view of the electronic device 402, showing the entire first element 102 and the entire second element 202.

In the electronic device 402 according to the present preferred embodiment, the first connection portion CN1 and the third connection portion CN3 of the first element 102 are joined to the surface of the circuit board 301. The second connection portion CN2 and the fourth connection portion CN4 of the second element 202 are joined to the surface of the circuit board 301.

Specifically, the plurality of first connection portion side electrodes (the first signal electrode E11 and the first ground electrodes E12 and E13) and the plurality of first board side electrodes (the first signal conductor pattern C11 and the first ground conductor patterns C12 and C13) are opposed to each other, and are each joined with a conductive joining material, such as solder, for example. The plurality of second connection portion side electrodes (the second signal electrode E21 and the second ground electrodes E22 and E23) and the plurality of second board side electrodes (the second signal conductor pattern C21 and the second ground conductor patterns C22 and C23) are each joined with a conductive joining material, such as solder, for example. Furthermore, the plurality of third connection portion side electrodes (the first signal electrode E31 and the first ground electrodes E32 and E33) and the plurality of third board side electrodes (not illustrated) are opposed to each other, and are each joined with a conductive joining material, such as solder, for example. The plurality of fourth connection portion side electrodes (the second signal electrode E41 and the second ground electrodes E42 and E43) and the plurality of fourth board side electrodes (not illustrated) are opposed to each other, and are each joined with a conductive joining material, such as solder, for example.

In the present preferred embodiment, the first element 102 and the second element 202 are mounted as surface mounted components in the same or similar manner as the other elements. The first element 102 and the second element 202 are disposed at a predetermined position on the surface of the circuit board 301 by a mounter together with the other surface mounted components 91 and 92 and other elements, and then soldered by the collective reflow soldering method together with the surface mounted components 91 and 92 and other elements.

As shown in FIG. 11A, the plurality of second connection portion side electrodes (the second signal electrode E21 and the second ground electrodes E22 and E23) and the plurality of second board side electrodes (the second signal conductor pattern C21 and the second ground conductor patterns C22 and C23) are disposed along the second recess portion (the second recess portion NP2 in FIG. 10B) as viewed from the Z-axis direction. At least portions of the plurality of first connection portion side electrodes and the plurality of first board side electrodes (the first signal electrode E11, the first ground electrode E12, the first signal conductor pattern C11, and the first ground conductor pattern C12) overlap the second recess portion (NP2) as viewed from the Z-axis direction.

In the electronic device 402 according to the present preferred embodiment, the insulation joining material 5 is provided on the surface of the circuit board 301. As shown in FIG. 11A, at least a portion of the first narrow width portion of the first connection portion CN1 and the second narrow width portion of the second connection portion CN2 is covered with the insulation joining material 5. The insulation joining material 5 is preferably, for example, an epoxy thermosetting resin adhesive, an underfill, or other suitable material.

Here, the first narrow width portion TP1 shown in FIG. 10A refers to a portion that is provided in the first connection portion CN1 by the first recess portion NP1 and that is thinner than the width of the first transmission line portion CA1 (it is not limited to the width in the Y-axis direction and may be the width in the X-axis direction, for example). The second narrow width portion TP2 shown in FIG. 10B refers to a portion that is formed in the second connection portion CN2 by the second recess portion NP2 and that is thinner than the width of the second transmission line portion CA2 (it is not limited to the width in the Y-axis direction and may be the width in the X-axis direction, for example). Note that the same concept as the first narrow width portion TP1 and the second narrow width portion TP2 described above also applies to the third narrow width portion TP3 and the fourth narrow width portion TP4.

The electronic device 402 of the present preferred embodiment achieves the following advantageous effects in addition to the advantageous effects described in the first preferred embodiment.

In the electronic device 402 according to the present preferred embodiment, the first element 102 and the second element 202, similar to the other surface mounted components, are mounted as surface mounted components by a reflow process. Thus, the manufacturing process is able to be simplified. In this structure, the first surface S1 of the first element 101 and the second surface S2 of the second element 202 are able to be fixed to face the surface of the circuit board 301, and thus, positional fluctuation as in a case of using a coaxial cable is less likely to occur.

The first element 102 according to the present preferred embodiment includes the third recess portion NP3 in the third connection portion CN3. According to this structure, in a case of connecting the third connection portion CN3 to another component (for example, an unillustrated third element), the same advantageous operations and effects as those described in the first preferred embodiment (advantageous operations and effects related to the connection between the first connection portion CN1 and the second connection portion CN2) in relation to the connection between the third connection portion CN3 and another component are achieved. Note that in a case of not connecting the third connection portion CN3 to another component, the third recess portion NP3 is not needed.

Similarly, the second element 202 according to the present preferred embodiment includes the fourth recess portion NP4 in the fourth connection portion CN4. According to this structure, in a case of connecting the fourth connection portion CN4 to another component (for example, an unillustrated fourth element), the same advantageous operations and effects as those described in the first preferred embodiment in relation to the connection between the fourth connection portion CN4 and another component are achieved. Note that in a case of not connecting the fourth connection portion CN4 to another component, the fourth recess portion NP4 is not needed.

In the present preferred embodiment, the third connection portion CN3 of the first element 102 (the plurality of third connection portion side electrodes) is connected to the circuit board 301 with a conductive joining material, and the fourth connection portion CN4 of the second element 202 is connected to the circuit board 301 with a conductive joining material. That is, in the present preferred embodiment, since the connection is not performed using a connector and a receptacle, the transmission loss is reduced as compared with the electronic device 401 according to the first preferred embodiment.

In the present preferred embodiment, the first element 102 and the second element 202 are mounted on the surface of the circuit board 301. The present preferred embodiment has a structure in which a plurality of elements are mounted on the surface of a circuit board and the plurality of elements are connected by a conductor provided in contact with the circuit board. In such a case in which a long transmission line is necessary, as shown in FIG. 11B, the first element 102 and the second element 202 may be mounted on the surface of the circuit board 301 and connected to each other. In general, it is difficult to mount an elongated element on the surface of a circuit board. In contrast, in the present preferred embodiment, a long transmission line is able to be easily provided only by mounting short elements (the first element 102 and the second element 202). In addition, short elements are easily mounted, as compared to a case in which a single element including a long transmission line is mounted on the surface of the circuit board 301. The present preferred embodiment has a structure in which small elements (the first and second elements) separated from the mother board are connected to each other, and thus, manufacturing is easy and the number of elements may be increased as compared to a case of separating a single element having a long (or large) shape from the mother board.

In the first element 102 according to the present preferred embodiment, the width of the first connection portion CN1 in the width direction (the Y-axis direction) of the first transmission line portion CA1 and the width of the third connection portion CN3 in the width direction of the first transmission line portion CA1 are thicker than the width of the first transmission line portion CA1. According to this structure, even if the first transmission line portion CA1 has an elongated shape, disposing the first element 102 on the surface of the circuit board 301 does not allow the first element 102 to fall over, thus allowing the first element 102 to be easily disposed on the surface of the circuit board 301. That is, according to this structure, the stability of the first element 102 disposed on the surface of the circuit board 301 increases, thus increasing the mountability of the first element 102.

As shown in FIG. 11B, if the first connection portion CN1 and the second connection portion CN2 have plan shapes that fit each other as viewed from the Z-axis direction, the first element 102 and the second element 202 are also able to be separated farther from the base material in a state of the same collective board.

Note that the same advantageous operations and effects are achieved even when the width of the second connection portion CN2 in the width direction (the Y-axis direction) of the second transmission line portion CA2 and the width of the fourth connection portion CN4 in the width direction of the second transmission line portion CA2 are thicker than the width of the second transmission line portion CA2.

In the present preferred embodiment, the plurality of second connection portion side electrodes (the second signal electrode E21 and the second ground electrodes E22 and E23) and the plurality of second board side electrodes (the second signal conductor pattern C21 and the second ground conductor patterns C22 and C23) are each disposed along the second recess portion (NP2) as viewed from the Z-axis direction. In the present preferred embodiment, at least portions of the plurality of first connection portion side electrodes and the plurality of first board side electrodes (the first signal electrode E11, the first ground electrode E12, the first signal conductor pattern C11, and the first ground conductor pattern C12) overlap the second recess portion (NP2) as viewed from the Z-axis direction. In this structure, a portion of the second connection portion CN2 is disposed in the first recess portion (NP1), and a portion of the first connection portion CN1 is disposed in the second recess portion (NP2). Therefore, the footprint necessary for the connection between the first connection portion CN1 and the second connection portion CN2 is able to be further reduced, and the conductor loss is able to be further reduced.

In the present preferred embodiment, at least a portion of the first narrow width portion of the first connection portion CN1 and the second narrow width portion of the second connection portion CN2 is covered with the insulation joining material 5. Of the first element 102 and the second element 202, the narrow width portions (the first narrow width portion TP1, the second narrow width portion TP2, the third narrow width portion TP3, and the fourth narrow width portion TP4) are lower in strength than other portions. Therefore, after the first element 102 and the second element 202 are mounted on the surface of the circuit board 301, the narrow width portions are prone to peel or get damaged. However, as in the present preferred embodiment, covering at least a portion of the narrow width portions with the insulation joining material 5 reduced or prevents the narrow width portions from peeling or getting damaged. The insulation joining material 5 preferably covers the entire or substantially the entire narrow width portions (the first narrow width portion, the second narrow width portion, the third narrow width portion, and the fourth narrow width portion).

The insulation joining material 5 is preferably, for example, an adhesive that is thermally cured at a temperature equal or substantially equal to the melting temperature of the conductive joining material used for joining a plurality of electrodes. In that case, the insulation joining material 5 is able to be provided simultaneously with the mounting of the first element 102 and the second element 202 by the reflow process, thus enabling the manufacturing process to be simplified.

Note that in the example of the electronic device 402 according to the present preferred embodiment, only the first connection portion CN1 and the third connection portion CN3 of the first element 101 are joined to the surface of the circuit board 301, but the present invention is not limited to this structure. The first transmission line portion CA1 may be joined to the surface of the circuit board 301 via a double-sided adhesive tape or other suitable structure, for example. Alternatively, an electrode may be provided on the first surface S1 of the first transmission line portion CA1 and may be joined to the electrode provided on the circuit board 301 with a conductive joining material. Similarly, the second transmission line portion CA2 may be joined to the surface of the circuit board 301 via a double-sided adhesive tape or other suitable structure. Alternatively, an electrode may be provided on the second surface S2 of the second transmission line portion CA2 and may be joined to the electrode provided on the circuit board 301 with a conductive joining material.

Third Preferred Embodiment

In regard to a third preferred embodiment of the present invention, an example of an electronic device including a plurality of first elements is shown.

Figure 12:
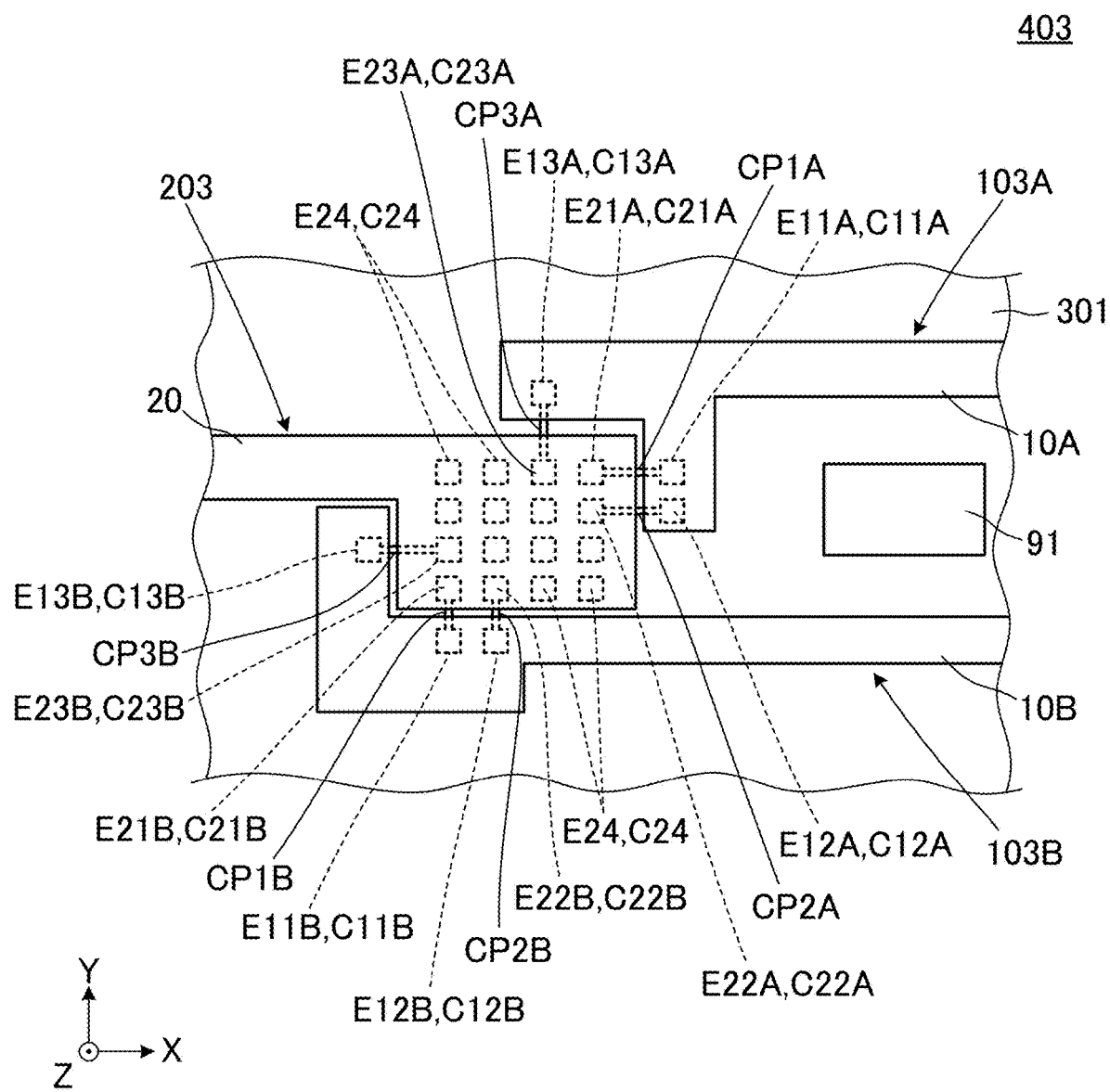
FIG. 12 is a plan view showing a main portion of an electronic device 403 according to a third preferred embodiment of the present invention.
Figure 13A:
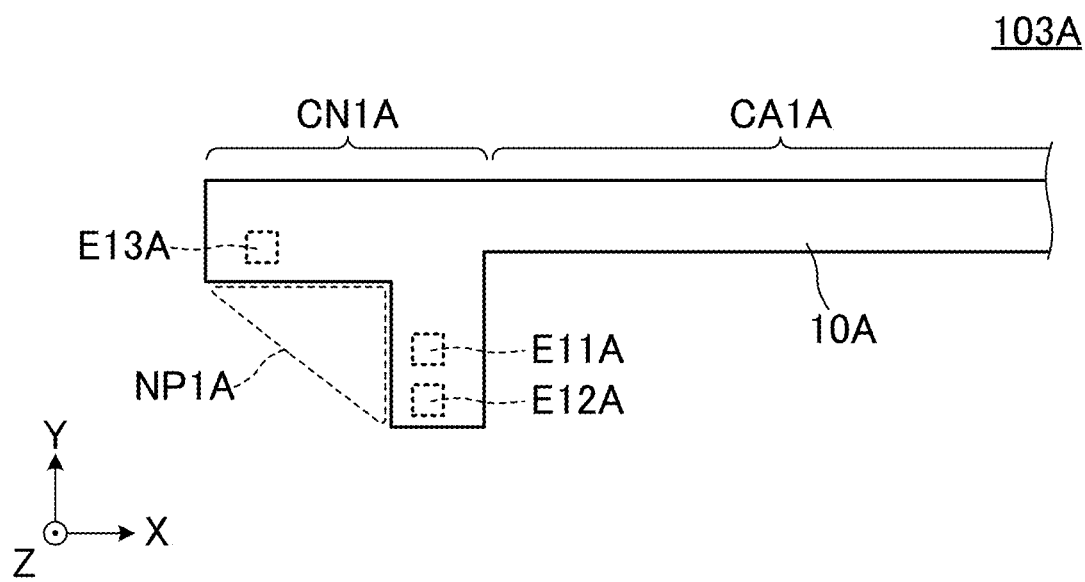
FIG. 13A is a plan view showing a first connection portion CN1A of a first element 103A according to the third preferred embodiment.
Figure 13B:
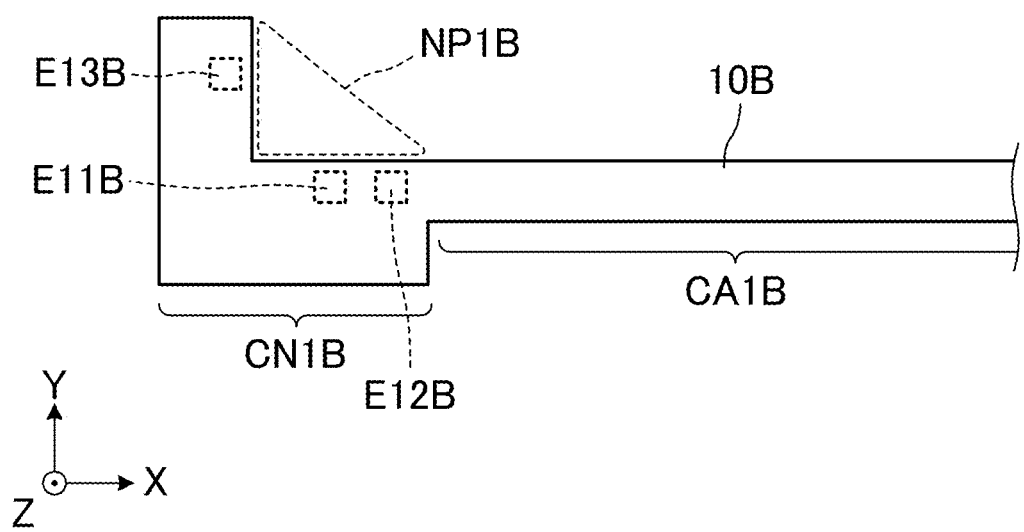
FIG. 13B is a plan view showing a first connection portion CN1B of a first element 103B according to the third preferred embodiment of the present invention.
Figure 14:
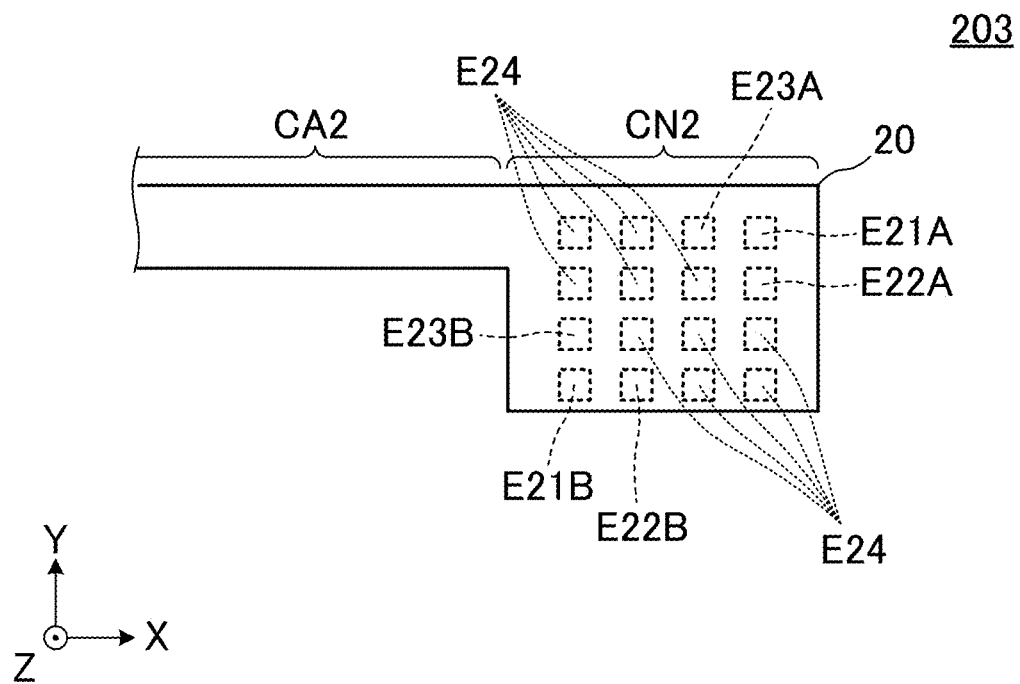
FIG. 14 is a plan view showing a second connection portion CN2 of a second element 203 according to the third preferred embodiment of the present invention.

FIG. 12 is a plan view showing the main portion of an electronic device 403 according to the third preferred embodiment. FIG. 13A is a plan view showing a first connection portion CN1A of a first element 103A according to the third preferred embodiment, and FIG. 13B is a plan view showing the first connection portion CN1B of the first element 103B according to the third preferred embodiment. FIG. 14 is a plan view showing the second connection portion CN2 of the second element 203 according to the third preferred embodiment.

As shown in FIG. 12, the electronic device 403 includes a circuit board 301, a first elements 103A and 103B, a second element 203, a surface mounted component 91, and other elements.

The first elements 103A and 103B differ from the first element 101 according to the first preferred embodiment in the plan shape of the first connection portion. The remaining structure is the same or substantially the same as that of the first element 101. The second element 203 differs from the second element 201 according to the first preferred embodiment in the structure of the second connection portion. The second element 202 differs from the second element 201 in that the longitudinal direction coincides with the X-axis direction. The remaining structure is the same substantially the same as that of the second element 201.

Hereinafter, different portions from those of the electronic device 401 according to the first preferred embodiment will be described.

As shown in FIG. 13A, the first element 103A includes the first connection portion CN1A, the third connection portion (not illustrated), a first transmission line portion CA1A, the first signal electrode E11A, the first ground electrodes E12A and E13A, and other elements. The first signal electrode E11A and the first ground electrodes E12A and E13A are exposed to the first surface of the first connection portion CN1 (the back surface of the first element 103A in FIG. 13A).

As shown in FIG. 13B, the first element 103B includes the first connection portion CN1B, the third connection portion (not illustrated), a first transmission line portion CA1B, the first signal electrode E11B, the first ground electrodes E12B and E13B, and the like. The first signal electrode E11B and the first ground electrodes E12B and E13B are exposed to the first surface of the first connection portion CN1B (the back surface of the first element 103B in FIG. 13B).

In the present preferred embodiment, the first signal electrodes E11A and E11B and the first ground electrodes E12A, E12B, E13A, and E13B correspond to "a plurality of first connection portion side electrodes".

The first connection portion CN1A of the first element 103A is preferably, for example, an L-shaped portion having a right-angled triangular first recess portion NP1A. The first connection portion CN1B of the first element 103B is preferably, for example, an L-shaped portion having a right-angled triangular first recess portion NP1B.

As shown in FIG. 14, the second element 203 includes the second connection portion CN2, the fourth connection portion (not illustrated), the second transmission line portion CA2, the second signal electrodes E21A and E21B, second ground electrodes E22A, E22B, E23A, E23B, and E24, and other elements. In the present preferred embodiment, the second transmission line portion CA2 includes two second signal conductors (see the second signal conductor 61 shown in FIG. 8B).

The second signal electrodes E21A and E21B and the second ground electrodes E22A, E22B, E23A, E23B, and E24 are exposed to the second surface of the second connection portion CN2 (the back surface of the second element 203 in FIG. 14). The second signal electrode E21A is electrically connected to one of the second signal conductors, and the second signal electrode E21B is electrically connected to the other of the second signal conductors.

In the present preferred embodiment, the second signal electrodes E21A and E21B and the second ground electrodes E22A, E22B, E23A, E23B, and E24 correspond to "a plurality of second connection portion side electrodes".

The second connection portion CN2 of the second element 203 is preferably, for example, a rectangular or substantially rectangular portion.

As shown in FIG. 12, the circuit board 301 includes the plurality of first board side electrodes (the first signal conductor patterns C11A and C11B and the first ground conductor patterns C12A, C12B, C13A, and C13B), the plurality of second board side electrodes (the second signal conductor patterns C21A and C21B and the second ground conductor patterns C22A, C22B, C23A, C23B, and C24), the plurality of electrode connection patterns CP1A, CP1B, CP2A, CP2B, CP3A, and CP3B, and other elements.

As shown in FIG. 12, the electrode connection pattern CP1A connects the first signal conductor pattern C11A and the second signal conductor pattern C21A to each other. The electrode connection pattern CP2A connects the first ground conductor pattern C12A and the second ground conductor pattern C22A to each other. The electrode connection pattern CP3A connects the first ground conductor pattern C13A and the second ground conductor pattern C23A to each other. The electrode connection pattern CP1B connects the first signal conductor pattern C11B and the second signal conductor pattern C21B to each other. The electrode connection pattern CP2B connects the first ground conductor pattern C12B and the second ground conductor pattern C22B to each other. The electrode connection pattern CP3B connects the first ground conductor pattern C13B and the second ground conductor pattern C23B to each other.

In the electronic device 403 according to the present preferred embodiment, the first connection portion CN1A of the first element 103A, the first connection portion CN1B of the first element 103B, and the second connection portion CN2 of the second element 203 are joined to the surface of the circuit board 301.

Specifically, the plurality of first connection portion side electrodes (the first signal electrodes E11A and E11B and the first ground electrodes E12A, E12B, E13A, and E13B) and the plurality of first board side electrodes (the first signal conductor patterns C11A and C11B and the first ground conductor patterns C12A, C12B, C13A, and C13B) are opposed to each other, and are each joined with a conductive joining material, such as solder, for example. The plurality of second connection portion side electrodes (the second signal electrodes E21A and E21B and the second ground electrodes E22A, E22B, E23A, and E23B) and the plurality of second board side electrodes (the second signal conductor patterns C21A and C21B and the second ground conductor patterns C22A, C22B, C23A, and C23B) are each joined with a conductive joining material, such as solder, for example.

Accordingly, the first signal electrode E11A is electrically connected to the second signal electrode E21A via the first signal conductor pattern C11A, the electrode connection pattern CP1A, and the second signal conductor pattern C21A. The first ground electrode E12A is electrically connected to the second ground electrode E22A via the first ground conductor pattern C12A, the electrode connection pattern CP2A, and the second ground conductor pattern C22A. The first ground electrode E13A is electrically connected to the second ground electrode E23A via the first ground conductor pattern C13A, the electrode connection pattern CP3A, and the second ground conductor pattern C23A. The first signal electrode E11B is electrically connected to the second signal electrode E21B via the first signal conductor pattern C11B, the electrode connection pattern CP1B, and the second signal conductor pattern C21B. The first ground electrode E12B is electrically connected to the second ground electrode E22B via the first ground conductor pattern C12B, the electrode connection pattern CP2B, and the second ground conductor pattern C22B. The first ground electrode E13B is electrically connected to the second ground electrode E23B via the first ground conductor pattern C13B, the electrode connection pattern CP3B, and the second ground conductor pattern C23B.

Even with such a structure, similarly to the electronic device 401 described in the first preferred embodiment, the footprint necessary to connect between the first connection portions CN1A and CN1B and the second connection portion CN2 is able to be reduced, and conductor loss is able to be reduced. Note that in a case of branching to a plurality of first elements at the connection portion of a second element having a plurality of signal conductors as in the present preferred embodiment, the above structure enables the degree of freedom in the arrangement of the first element and the second element to be improved, the line lengths of the plurality of electrode connection patterns to be shortened, and thus, the conductor loss to be reduced.

Note that in the present preferred embodiment, an example of branching to the plurality of first elements at the connection portion of the second element is shown, but the present invention is not limited to this structure. Conversely, a structure of branching to a plurality of second elements at the connection portion of the first element may be provided.

Moreover, in the present preferred embodiment, the structure of connection to the two first connection portions CN1A and CN1B in the second connection portion CN2 of the second element is shown, but the present invention is not limited to this structure. It may be connected to three or more first connection portions in the second connection portion CN2. Conversely, a structure of connection to two or more second connection portions in the first connection portion may be provided.

Also, in the present preferred embodiment, the example in which the number of the second signal conductors is two is shown, but the present invention is not limited to this structure. The number of the second signal conductors may be appropriately changed within the range in which the advantageous operations and effects of the present invention are achieved, and may be three or more. Similarly, the number of the first signal conductors may be two or more.

Fourth Preferred Embodiment

In regard to a fourth preferred embodiment of the present invention, an example in which the configuration of the second element differs from that of the second element according to the first, second, and third preferred embodiments is shown.

Figure 15:
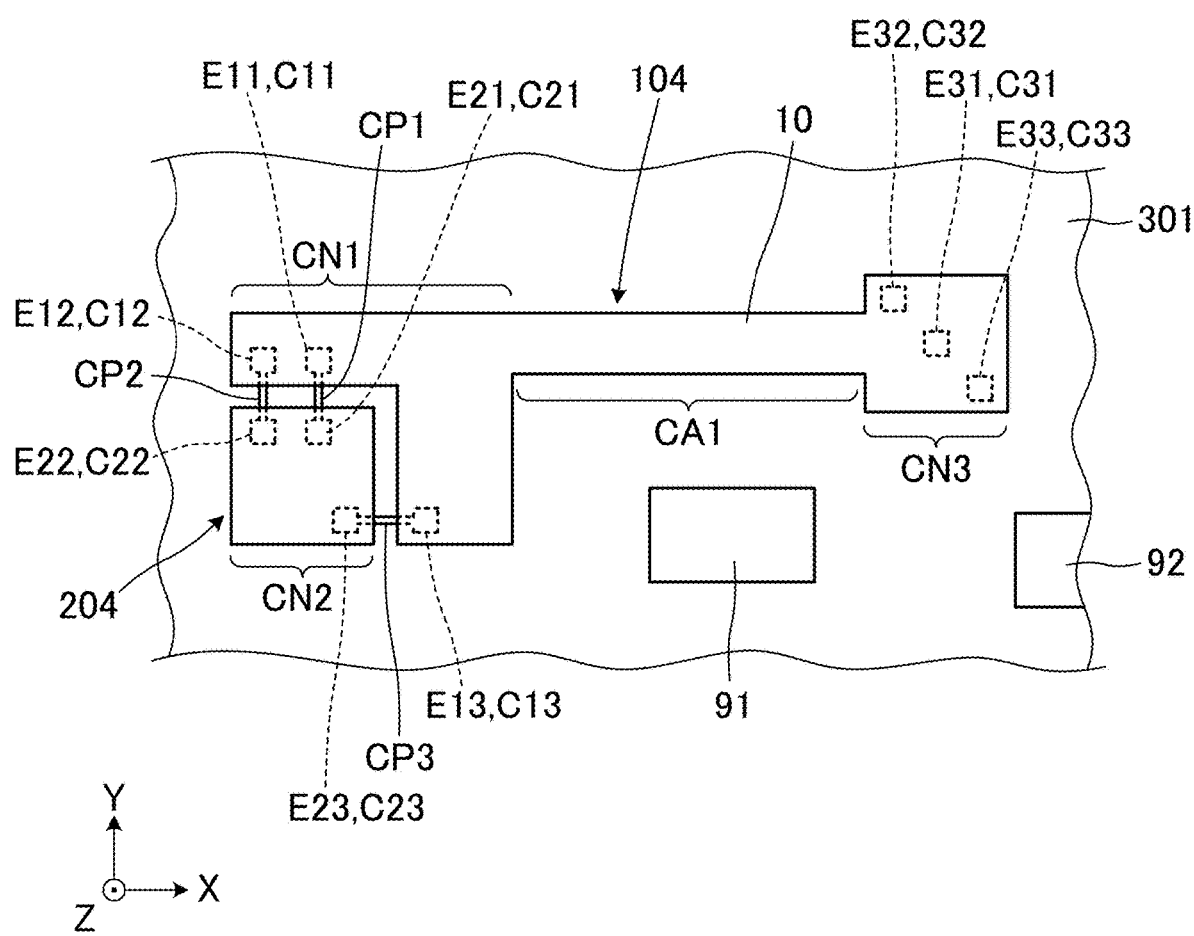
FIG. 15 is a plan view showing a main portion of an electronic device 404 according to a fourth preferred embodiment of the present invention.
Figure 16:
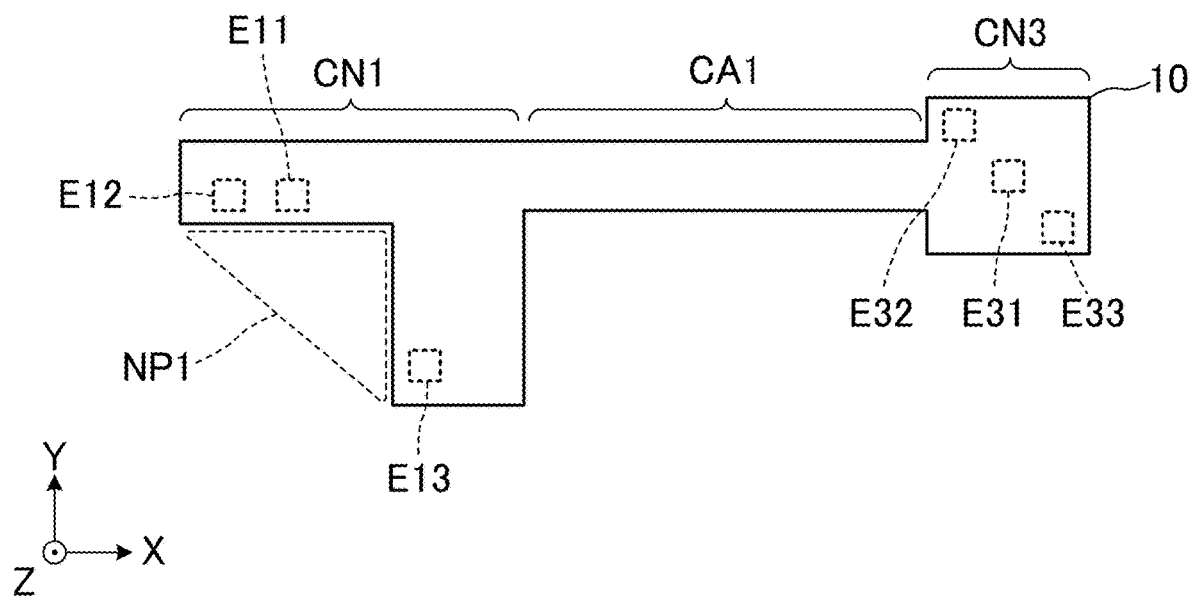
FIG. 16 is a plan view of a first element 104 according to the fourth preferred embodiment of the present invention.

FIG. 15 is a plan view showing the main portion of an electronic device 404 according to the fourth preferred embodiment. FIG. 16 is a plan view of the first element 104 according to the fourth preferred embodiment.

As shown in FIG. 15, the electronic device 404 includes the circuit board 301, the first element 104, a second element 204, the surface mounted components 91 and 92, and other elements.

The first element 104 is the same or substantially the same as the first element 102 according to the second preferred embodiment. The second element 204 differs from the second element 202 according to the second preferred embodiment in that the plan shape is preferably, for example, rectangular or substantially rectangular.

Hereinafter, portions different from those of the electronic device 402 according to the second preferred embodiment will be described.

The second element 204 includes the second connection portion CN2, the second signal electrode E21, and the second ground electrodes E22 and E23. The second element 204 is preferably, for example, a semiconductor microprocessor chip or a semiconductor IC chip.

The second signal electrode E21 and the second ground electrodes E22 and E23 are exposed to the second surface (the back surface of the second element 204 in FIG. 15).

In the present preferred embodiment, the second signal electrode E21 and the second ground electrodes E22 and E23 correspond to "a plurality of second connection portion side electrodes".

In the electronic device 404 according to the present preferred embodiment, the first connection portion CN1 and the third connection portion CN3 of the first element 104 are joined to the surface of the circuit board 301. The second connection portion CN2 of the second element 202 is joined to the surface of the circuit board 301.

As shown in FIG. 15, the plurality of first connection portion side electrodes (the first signal electrode E11 and the first ground electrodes E12 and E13) and the plurality of first board side electrodes (the first signal conductor pattern C11 and the first ground conductor patterns C12 and C13) are disposed along the first recess portion (the first recess portion NP1 shown in FIG. 16) as viewed from the Z-axis direction. The plurality of first board side electrodes and the plurality of second board side electrodes (the second signal conductor pattern C21 and the second ground conductor patterns C22 and C23) are respectively disposed at positions opposed to each other as viewed from the Z-axis direction.

As shown in FIG. 15, at least portions of the plurality of second connection portion side electrodes and the plurality of second board side electrodes (the second signal electrode E21 and the second signal conductor pattern C21) overlap the first recess portion (NP1) as viewed from the Z-axis direction. The plurality of second connection portion side electrodes and the plurality of second board side electrodes are disposed along the first recess portion (NP1) as viewed from the Z-axis direction.

Even with such a structure, the basic structure of the electronic device 403 is the same or substantially the same as that of the electronic device 402 according to the second preferred embodiment, and the same advantageous operations and effects as those of the electronic device 402 are achieved.

Fifth Preferred Embodiment

In regard to a fifth preferred embodiment of the present invention, an example in which the structure of the first transmission line portion differs from that in the fourth preferred embodiment is shown.

Figure 17:
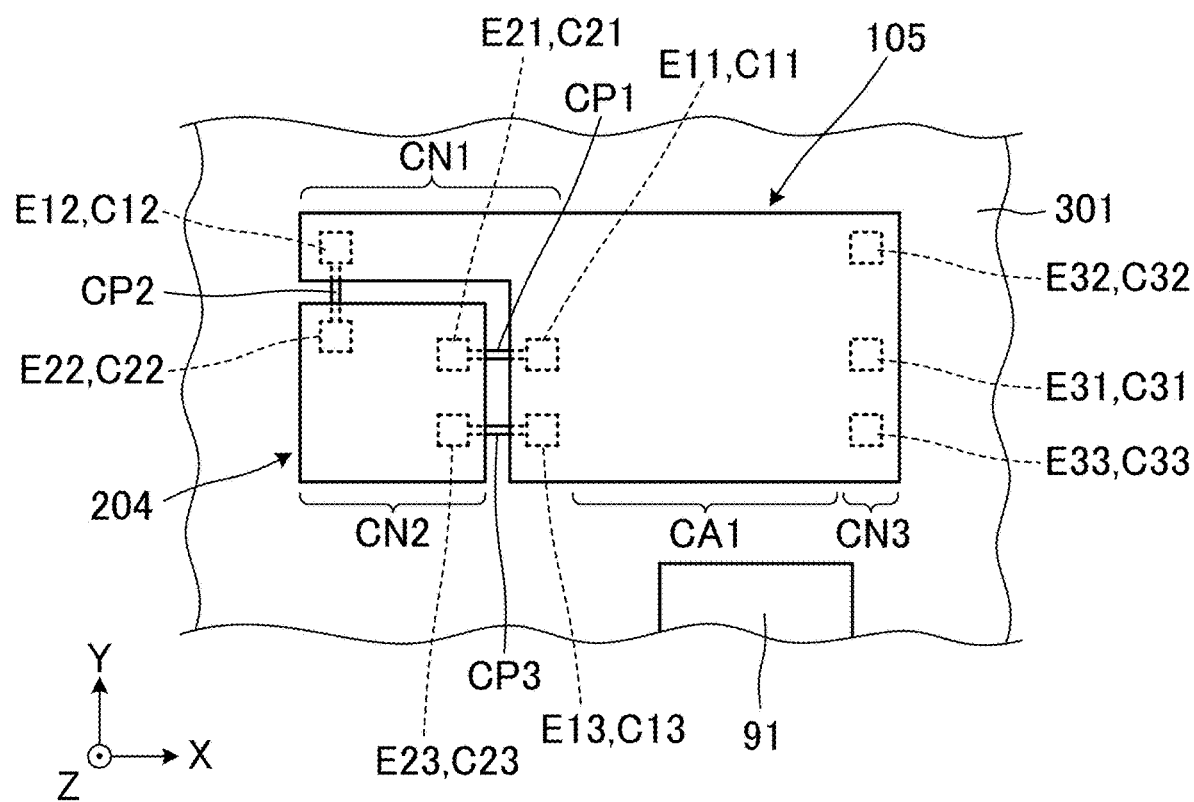
FIG. 17 is a plan view showing a main portion of an electronic device 405 according to a fifth preferred embodiment of the present invention.
Figure 18:
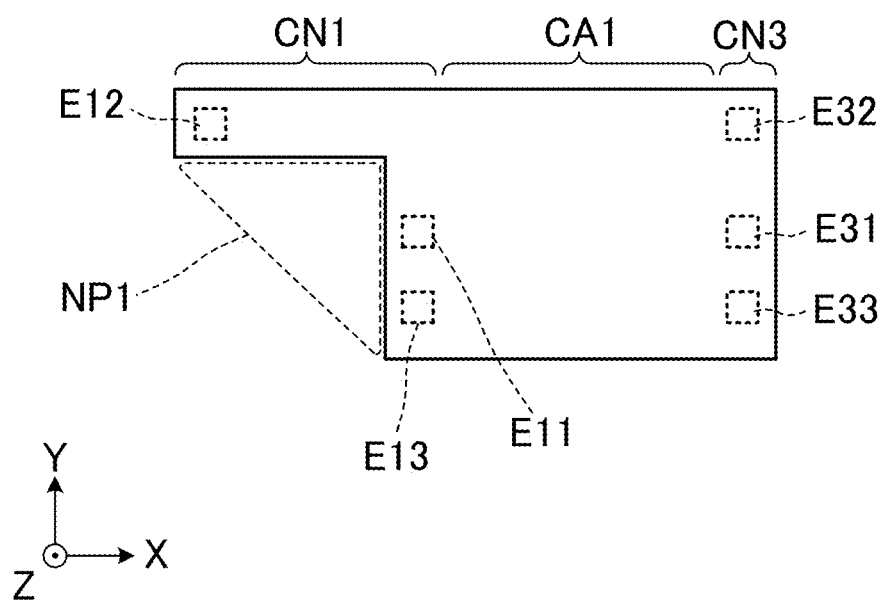
FIG. 18 is a plan view of a first element 105 according to the fifth preferred embodiment of the present invention.

FIG. 17 is a plan view showing the main portion of an electronic device 405 according to the fifth preferred embodiment. FIG. 18 is a plan view of the first element 105 according to the fifth preferred embodiment.

The first element 105 differs from the first element 104 according to the fourth preferred embodiment in the structure of the first transmission line portion CA1 and the structure of the third connection portion CN3. The remaining structure is the same or substantially the same as that of the first element 104.

Hereinafter, portions different from those of the electronic device 404 according to the fourth preferred embodiment will be described.

As shown in FIGS. 17 and 18, each of the width of the first connection portion CN1 in the width direction (the Y-axis direction) of the first transmission line portion CA1 and the width of the third connection portion CN3 in the width direction of the first transmission line portion CA1 is preferably the same or substantially the same as the width of the first transmission line portion CA1.

The plurality of third connection portion side electrodes (the first signal electrode E31 and the first ground electrodes E32 and E33) are aligned in the width direction (the Y-axis direction) of the first transmission line portion CA1 as viewed from the Z-axis direction.

Even with such a structure, the basic structure of the electronic device 404 is the same or substantially the same as that of the electronic device 404 according to the fourth preferred embodiment, and the same advantageous operations and effects as those of the electronic device 404 are achieved.

Note that in each of the preferred embodiments described above, an example of the first element including the first connection portion and the third connection portion and the second element including the second connection portion and the fourth connection portion has been shown and described, but the first element and the second element in the present invention are not limited to this structure. The first element may include another connection portion other than the first connection portion and the third connection portion, and the second element may include another connection portion other than the second connection portion and the fourth connection portion.

In each of the preferred embodiments described above, an example in which the first connection portion, the second connection portion, the third connection portion, and the fourth connection portion have the L-shaped or rectangular or substantially rectangular plan shapes has been shown and described, but the present invention is not limited to this structure. The plan shapes of the first connection portion, the second connection portion, the third connection portion, and the fourth connection portion may be appropriately changed within the range in which the advantageous operations and effects of the present invention are achieved, and may be polygonal, circular, elliptical, or other suitable shapes, for example. That is, the plan shapes of the first recess portion, the second recess portion, the third recess portion, and the fourth recess portion are not limited to the right-angled triangle. The plan shapes of the first recess portion, the second recess portion, the third recess portion, and the fourth recess portion may be appropriately changed within the range in which the advantageous operations and effects of the present invention are achieved, and may be polygonal, circular, elliptical, or other suitable shapes, for example.

In each of the preferred embodiments described above, an example in which the first base material 10 and the second base material 20 are laminates provided by laminating the plurality of insulating base material layers made of a thermoplastic resin has been shown and described, but the present invention is not limited to this structure. The first base material 10 and the second base material 20 may be laminates provided by laminating a plurality of insulating base material layers made of a thermosetting resin, for example.

In each of the preferred embodiments described above, an example in which the first base material 10 and the second base material 20 are provided by laminating the three insulating base material layers and one protective layer has been shown and described, but the first base material 10 and the second base material 20 are not limited to this structure. The number of layers of the insulating base material layers of the first base material 10 and the second base material 20 may be appropriately changed within the range in which the advantageous operations and effects of the present invention are achieved. Note that in the first base material 10 and the second base material 20, a protective layer is not required.

In each of the preferred embodiments described above, an example in which the first transmission line portion of the first element and the second transmission line portion of the second element are in a straight line extending in the X-axis direction or the Y-axis direction has been shown and described, but the present invention is not limited to this structure. The first transmission line portion and the second transmission line portion may be in a curved line, for example.

In each of the preferred embodiments described above, a structure in which the first transmission line portion includes the first signal conductor 31 and the first ground conductors 41 and 42 and the second transmission line portion includes the second signal conductor 61 and the second ground conductors 71 and 72 has been shown and described, but the present invention is not limited to this structure. The first transmission line portion may only include the first signal conductor 31, and the second transmission line portion may only include the second signal conductor 61.

In each of the preferred embodiments described above, an example of the first element including the stripline first transmission line portion or the second element including the stripline second transmission line portion has been shown and described, but the present invention is not limited to this structure. The first transmission line portion of the first element and the second transmission line portion of the second element may be similarly applied to a case of other types of transmission lines, such as a microstrip line, a coplanar line, and a slot line, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device, comprising:
   a circuit board;
   a first element including a first surface and at least a portion of which is joined to a surface of the circuit board; and
   a second element including a second surface and at least a portion of which is joined to the surface of the circuit board; wherein
   the first element includes a first connection portion including a first recess portion, a third connection portion, a first transmission line portion connecting the first connection portion and the third connection portion to each other, and a plurality of first connection portion side electrodes exposed to the first surface of the first connection portion;
   the second element includes a second connection portion and a plurality of second connection portion side electrodes exposed to the second surface of the second connection portion;
   the circuit board includes a plurality of first board side electrodes, a plurality of second board side electrodes, and a plurality of electrode connection patterns connecting the plurality of first board side electrodes and the plurality of second board side electrodes to each other;
   the plurality of first connection portion side electrodes and the plurality of first board side electrodes are opposed to each other and are each joined with a conductive joining material;
   the plurality of second connection portion side electrodes and the plurality of second board side electrodes are opposed to each other and are each joined with a conductive joining material;
   the plurality of first connection portion side electrodes and the plurality of first board side electrodes are respectively disposed along the first recess portion in plan view of the circuit board; and
   the plurality of first board side electrodes and the plurality of second board side electrodes are respectively disposed at positions opposed to each other in plan view of the circuit board.

2. The electronic device according to claim 1, wherein the plurality of second connection portion side electrodes and the plurality of second board side electrodes are disposed such that at least portions thereof overlap the first recess portion in plan view of the circuit board.

3. The electronic device according to claim 2, wherein the plurality of second connection portion side electrodes and the plurality of second board side electrodes are disposed along the first recess portion in plan view of the circuit board.

4. The electronic device according to claim 1, wherein a width of the first connection portion in a width direction of the first transmission line portion is thicker than a width of the first transmission line portion.

5. The electronic device according to claim 1, wherein
   the first element includes a plurality of third connection portion side electrodes exposed to the first surface of the third connection portion;
   the circuit board includes a plurality of third board side electrodes; and
   the plurality of third connection portion side electrodes and the plurality of third board side electrodes are opposed to each other and are each joined with a conductive joining material.

6. The electronic device according to claim 5, wherein a width of the first connection portion in a width direction of the first transmission line portion and a width of the third connection portion in the width direction of the first transmission line portion are thicker than a width of the first transmission line portion.

7. The electronic device according to claim 1, wherein
   the first transmission line portion includes a first signal conductor; and
   the plurality of first connection portion side electrodes include a first signal electrode electrically connected to the first signal conductor.

8. The electronic device according to claim 7, wherein
   the first transmission line portion includes a first ground conductor; and
   the first connection portion side electrode includes a first ground electrode connected to the first ground conductor.

9. The electronic device according to claim 7, wherein a plurality of the first signal conductors are provided.

10. The electronic device according to claim 1, wherein the second element further includes a fourth connection portion and a second transmission line portion which connects the second connection portion and the fourth connection portion to each other.

11. The electronic device according to claim 10, wherein a width of the second connection portion in a width direction of the second transmission line portion is thicker than a width of the second transmission line portion.

12. The electronic device according to claim 10, wherein
   the second element includes a plurality of fourth connection portion side electrodes exposed to the second surface of the fourth connection portion;
   the circuit board includes a plurality of fourth board side electrodes; and
   the plurality of fourth connection portion side electrodes and the plurality of fourth board side electrodes are opposed to each other and are each joined with a conductive joining material.

13. The electronic device according to claim 12, wherein a width of the second connection portion in a width direction of the second transmission line portion and a width of the fourth connection portion in the width direction of the second transmission line portion are thicker than a width of the second transmission line portion.

14. The electronic device according to claim 10, wherein
the second transmission line portion includes a second signal conductor; and
the plurality of second connection portion side electrodes include a second signal electrode connected to the second signal conductor.

15. The electronic device according to claim 14, wherein
the second transmission line portion includes a second ground conductor; and
the plurality of second connection portion side electrodes include a second ground electrode connected to the second ground conductor.

16. The electronic device according to claim 14, wherein a plurality of the second signal conductors are provided.

17. The electronic device according to claim 1, wherein
the second connection portion includes a second recess portion;
the plurality of second connection portion side electrodes and the plurality of second board side electrodes are disposed along the second recess portion in plan view of the circuit board; and
the plurality of first connection portion side electrodes and the plurality of first board side electrodes are disposed such that at least portions thereof overlap the second recess portion in plan view of the circuit board.

18. The electronic device according to claim 1, wherein the first recess portion is a right-angled triangular recess portion.

19. The electronic device according to claim 18, wherein the first recess portion is L-shaped.

20. The electronic device according to claim 1, wherein the second connection portion has a rectangular or substantially rectangular shape.

* * * * *